(12) United States Patent
Chiang et al.

(10) Patent No.: US 11,101,814 B2
(45) Date of Patent: Aug. 24, 2021

(54) TIME-INTERLEAVED SUCCESSIVE APPROXIMATION REGISTER ANALOG TO DIGITAL CONVERTER WITH GROUPED DIGITAL TO ANALOG CAPACITORS

(71) Applicant: BRIGHAM YOUNG UNIVERSITY, Provo, UT (US)

(72) Inventors: Shiuh-hua Wood Chiang, Vineyard, UT (US); Yixin Song, Provo, UT (US); Eric Swindlehurst, Provo, UT (US); Jensen Hunter, Provo, UT (US); Yen-Cheng Kuan, Provo, UT (US)

( * ) Notice: Subject to any disclaimer, the term of this patent is extended or adjusted under 35 U.S.C. 154(b) by 0 days.

(21) Appl. No.: 17/030,201

(22) Filed: Sep. 23, 2020

(65) Prior Publication Data
US 2021/0091781 A1  Mar. 25, 2021

Related U.S. Application Data

(60) Provisional application No. 62/904,370, filed on Sep. 23, 2019.

(51) Int. Cl.
*H03M 1/66* (2006.01)
*H03M 1/46* (2006.01)
*H03M 1/00* (2006.01)
*H03M 1/06* (2006.01)

(52) U.S. Cl.
CPC ........... *H03M 1/462* (2013.01); *H03M 1/002* (2013.01); *H03M 1/0678* (2013.01); *H03M 1/466* (2013.01)

(58) Field of Classification Search
CPC .. H03M 1/1245; H03M 3/458; H03M 1/1466; H03M 1/468; H03M 11/02; H03M 1/20; H03M 1/66; H03M 1/804; H03M 1/46; H03M 1/1215; H03M 1/687; H03M 1/742; H03M 1/38; H03M 1/0602; H03M 1/12; H03M 1/68; H03M 1/745; H03M 1/765; H03M 1/403; H03M 1/466; H03M 1/76; H03M 1/0678
USPC ......................................... 341/144, 150, 172
See application file for complete search history.

(56) References Cited

U.S. PATENT DOCUMENTS

| | | | | |
|---|---|---|---|---|
| 7,446,365 | B1* | 11/2008 | Heshami | H01L 23/5223 257/296 |
| 7,456,462 | B1* | 11/2008 | Heshami | H01L 23/5223 257/296 |
| 10,630,307 | B1* | 4/2020 | Jones, III | H03M 1/38 |
| 2006/0086965 | A1 | 4/2006 | Sakaguchi et al. | |

(Continued)

OTHER PUBLICATIONS

D. Janke, A. Monk, E. Swindlehurst, K. Layton and S. W. Chiang, "A 9-Bit 10-MHz 28-µW SAR ADC Using Tapered Bit Periods and a Partially Interdigitated DAC," in IEEE Transactions on Circuits and Systems II: Express Briefs, vol. 66, No. 2, Jun. 2018, p. 187-191, entire document, especially fig 4, 7, p. 188, col. 2; p. 190, col. 1, para 2, col. 2, para 2; p. 191, col. 2, para 2.

*Primary Examiner* — Linh V Nguyen
(74) *Attorney, Agent, or Firm* — Morriss O'Bryant Compagni Cannon, PLLC

(57) ABSTRACT

The present invention is a system and method for providing a modified Digital-to-Analog converter (DAC) for use in a time-interleaved successive-approximation-register (SAR) analog-to-digital converter (ADC), the DAC including grouping of capacitance electrodes by Bit in a DAC, thereby reducing parasitic capacitances, and substantially improving power efficiency and speed to operate at GHz frequencies.

10 Claims, 24 Drawing Sheets

(56) References Cited

U.S. PATENT DOCUMENTS

| | | | |
|---|---|---|---|
| 2009/0290283 A1* | 11/2009 | Fong | H01L 28/60 361/306.2 |
| 2010/0061035 A1 | 11/2010 | Kitamura et al. | |
| 2014/0167992 A1* | 6/2014 | Aruga | H01G 4/38 341/143 |
| 2016/0254822 A1* | 9/2016 | Sugawara | H01L 27/0207 341/150 |
| 2016/0315630 A1* | 10/2016 | Edakkuttathil Muhammed | H01L 27/0805 |
| 2019/0189350 A1* | 6/2019 | Kabir | H01L 23/5223 |
| 2019/0244894 A1* | 8/2019 | Fu | H01L 23/5223 |
| 2019/0341925 A1* | 11/2019 | Wang | H03M 1/804 |
| 2020/0006314 A1* | 1/2020 | Caffee | H01L 27/01 |
| 2021/0006259 A1* | 1/2021 | Ponton | H03M 1/802 |

\* cited by examiner (a) Bit i Capacitor (b) DAC Resolution (bit)

| Radix 1.78, Not Quantized Caps | | | | | | | | | |
|---|---|---|---|---|---|---|---|---|---|
| | Total | $C_8$ | $C_7$ | $C_6$ | $C_5$ | $C_4$ | $C_3$ | $C_2$ | $C_1$ |
| Cap Value ($C_u$) | 127 | 56.1 | 31.6 | 17.8 | 10.0 | 5.6 | 3.2 | 1.8 | 1 |
| Bit Weight (LSB) | 255 | 112.2 | 63.1 | 35.5 | 20.0 | 11.2 | 6.3 | 3.6 | 2.0 |
| Redundancy (LSB) | | 30.5 | 16.5 | 8.6 | 4.1 | 1.6 | 0.2 | 0 | 0 |
| Quantized Caps First Embodiment | | | | | | | | | |
| Cap Value ($C_u$) | 127 | 60 | 28 | 16 | 10 | 6 | 4 | 2 | 1 |
| Bit Weight (LSB) | 255 | 120 | 56 | 32 | 20 | 12 | 8 | 4 | 2 |
| Redundancy (LSB) | | 15 | 23 | 15 | 7 | 3 | 0 | 0 | 1 |

*FIG. 12*

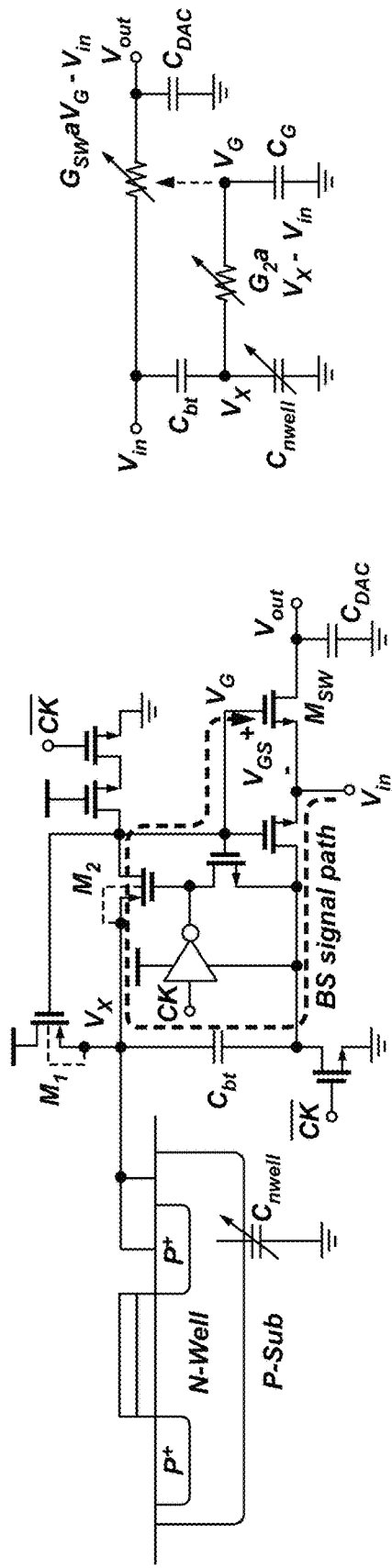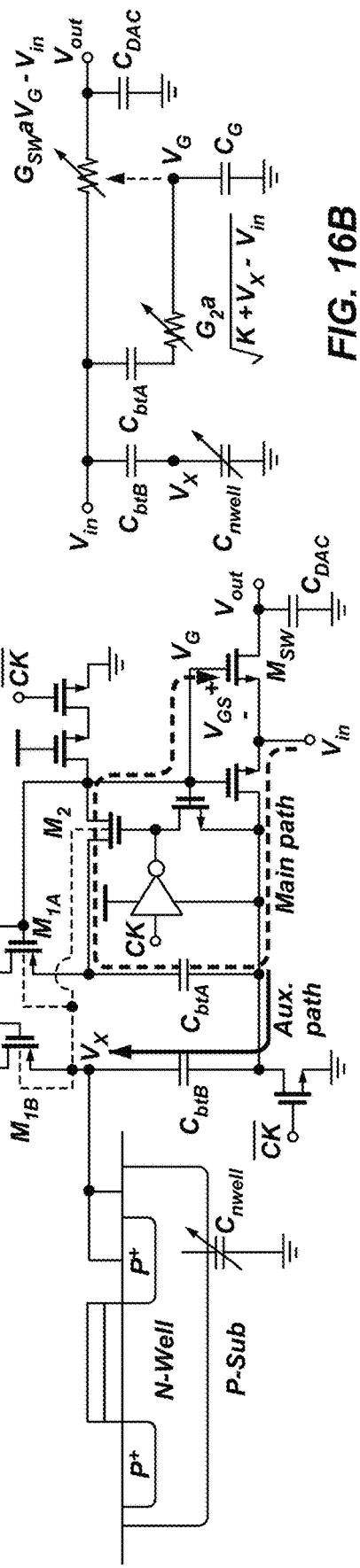
FIG. 15A *(Prior Art)*
FIG. 15B *(Prior Art)*
FIG. 16A
FIG. 16B

PERFORMANCE SUMMARY AND COMPARISON

| | VLS108 | ISSCC13 | ISSCC15 | ISSCC14 | ISSCC20 | This Work |
|---|---|---|---|---|---|---|
| Technology | 90 nm | 40 nm | 65nm | 28 nm SOI | 65 nm | 28 nm |
| Sampling Rate | 10.3 GHz | 10.3 GHz | 10 GHz | 10 GHz | 10 GHz | 10 GHz |
| Power | 1600 mW | 240 mW | 79 mW | 32 nW | 51 mW | 21 mW |
| SNDR @ Nyquist | 32.4 dB | 32.5 dB | 30.3 dB | 33.8 dB | 40.1 dB | 36.9 dB |
| SFDR @ Nyquist | N/A | N/A | N/A | 41.1 dB | 52.8 dB | 59.0 dB |
| Supply | N/A | 0.9 V | 1 V | 1 V | 1 V | 1 V |
| Area (mm²) | N/A | 0.27 | 0.81 | 0.009 | 0.095 | 0.022 |
| FoM (fJ/conv-step) | 4562 | 700 | 296 | 81 | 62 | 37 |

FIG. 25

TIME-INTERLEAVED SUCCESSIVE APPROXIMATION REGISTER ANALOG TO DIGITAL CONVERTER WITH GROUPED DIGITAL TO ANALOG CAPACITORS

BACKGROUND

Field of the Invention

This invention relates generally to successive-approximation-register (SAR) analog-to-digital converter (ADC). More specifically, the invention relates to the improved power efficiency that can obtained for a SAR ADC that uses an improved design for an internal digital-to-analog converter (DAC) that reduces parasitic capacitance to thereby minimize power usage of the DAC.

Description of Related Art

The architecture of a successive-approximation-register (SAR) analog-to-digital converter (ADC) has had to change as the speed of the SAR ADCs has increased. Architectures that function well at KHz and MHz frequencies operate poorly or not at all at GHZ speeds.

Recent work on high-speed analog-to-digital converters (ADCs) operating at >10 GHz with 6 to 8 bits of resolution has made progress, but significant challenges remain.

For example, in high-speed SAR ADCs, the total capacitance including both the DAC capacitance and its associated bottom-plate capacitance shown as C(DAC) and $C_{btm}$ in FIG. 1, has a significant impact on both the speed and power consumption of the overall converter. This is because the SAR logic typically employs minimum-sized digital circuits to reduce the logic power consumption. To ensure sufficient drive strength to switch the capacitors, a chain of drivers must be inserted between the SAR logic and the DAC. To minimize the delay for high-speed designs, the stages in the drive chain are sized by a tapering factor based on the gate parasitic factor of the process technology.

Therefore, for a given minimum-sized SAR logic, the greater the DAC load, the more stages are needed in the drive chain, and the greater the power and delay. The compounding effect of the DAC makes it a critical block to optimize.

In an effort to reduce the DAC size in recent years, ADCs have used custom lateral finger capacitors to achieve good matching at sub-fF unit capacitance levels. However, finger capacitors still face fundamental trade-offs between capacitance and matching. In addition, the problem of the bottom-plate parasitic capacitance which has a large impact in high-speed designs has received little attention.

Accordingly, it would be an advantage over the prior art to provide a new topography for a DAC that enabled increased speed and increased power efficiency through the reduction of parasitic capacitances in the DAC and the use of capacitance scaling of the bits that is not based on a power of 2, but something less.

BRIEF SUMMARY

The present invention is a system and method for providing a modified Digital-to-Analog converter (DAC) for use in a time-interleaved successive-approximation-register (SAR) analog-to-digital converter (ADC), the DAC including grouping of capacitance electrodes by Bit in a DAC, thereby reducing parasitic capacitances, and substantially improving power efficiency and speed to operate at GHz frequencies.

These and other embodiments of the present invention will become apparent to those skilled in the art from a consideration of the following detailed description taken in combination with the accompanying drawings.

BRIEF DESCRIPTION OF THE SEVERAL VIEWS OF THE DRAWINGS

FIG. 12 is a table that shows that scaling the capacitors at less than a factor of 2 improves the DAC.

FIG. 15A is a circuit diagram of a bootstrapped switch of the prior art for the ADC.

FIG. 15B is a simplified circuit diagram of its equivalent circuit during sampling.

FIG. 16A is a circuit diagram of a bootstrapped switch of the first embodiment for the ADC.

FIG. 16B is a simplified circuit diagram of its equivalent circuit during sampling.

FIG. 25 is a table showing a performance summary and comparison.

DETAILED DESCRIPTION

Reference will now be made to the drawings in which the various embodiments of the present invention will be discussed so as to enable one skilled in the art to make and use the invention. It is to be understood that the following description illustrates embodiments of the present invention and should not be viewed as narrowing the claims which follow.

A first improvement shown by the first embodiment of the invention demonstrates that it is possible to achieve simultaneous high speed and high power efficiency of the SAR ADC by using a time-interleaved SAR architecture with a low channel count. This requires a high single-channel speed which is made possible by aggressively scaling down the digital-to-analog-converter (DAC) capacitance C(DAC) and the bottom-plate parasitic capacitance ($C_{btm}$).

Figure 1:
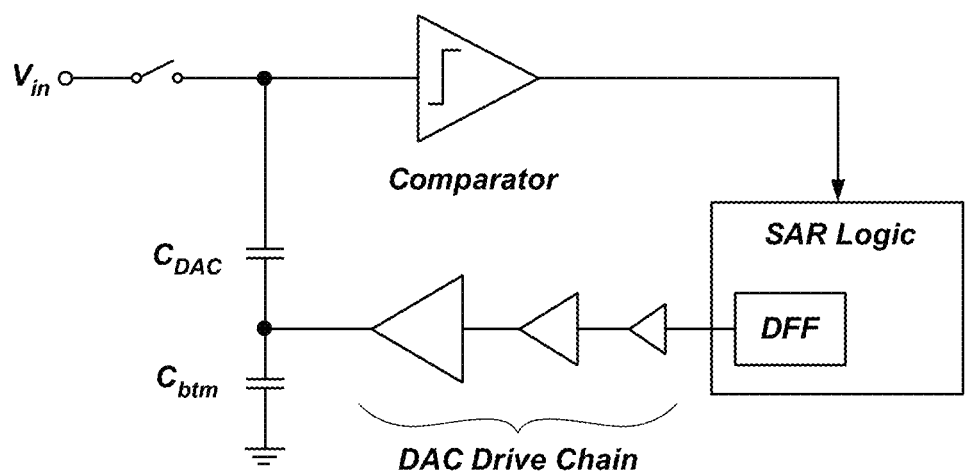
FIG. 1 is a SAR loop with $C_{DAC}$ and $C_{btm}$ loading the DAC drive chain.

FIG. 1 is a circuit schematic of a SAR loop showing C(DAC) and $C_{btm}$ with a DAC drive train.

Figure 2:
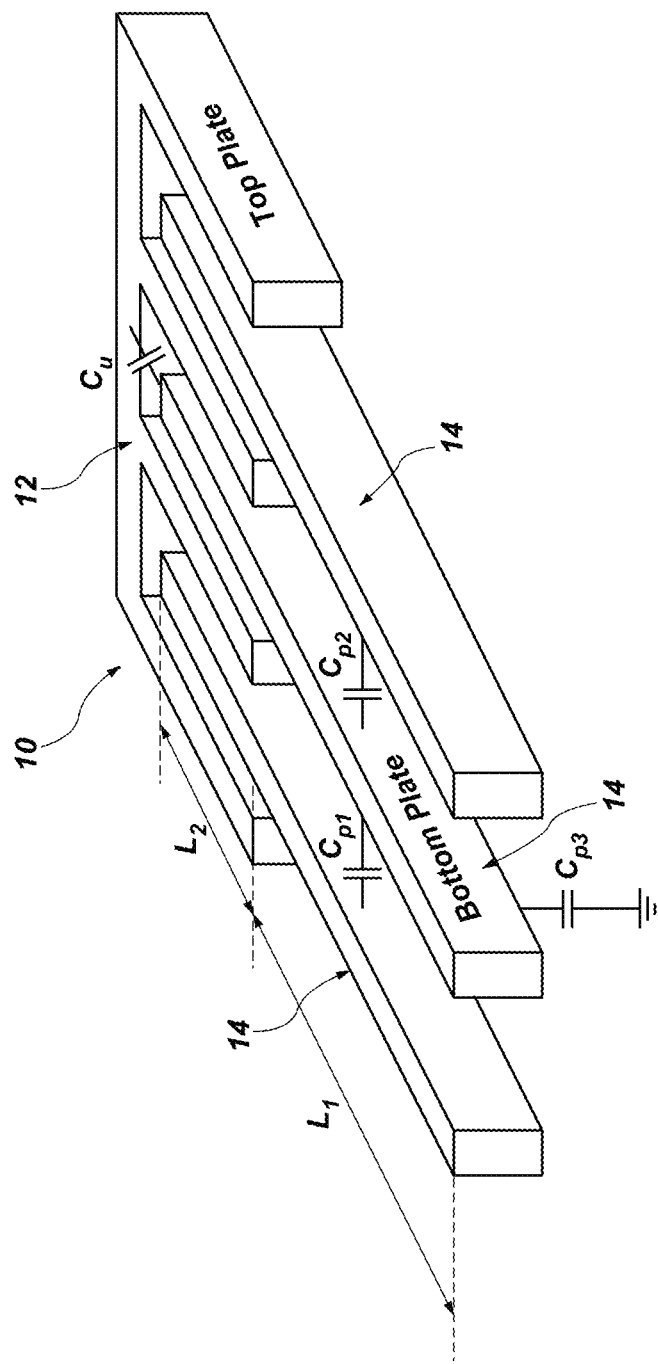
FIG. 2 is a diagram of the DAC in the SAR ADC showing what is commonly referred to as a top plate and bottom plates that forms a capacitor.

FIG. 2 is a diagram of the DAC 10 in the SAR ADC showing what is commonly referred to as a top plate 12 and a bottom plate 14 that form a capacitor. In this figure, three capacitors are shown because there are three bottom plates 14. While DACS are now arranged horizontally, the nomenclature of top and bottom plates remains, where the top plate 12 is the common metal and the bottom plates 14 receive the individual signals. An insulator of Silicon Oxide between the top plate 12 and the bottom plates 14 creates the capacitance of the DAC 10.

FIG. 2 shows that the DAC 10 of the first embodiment is arranged in an array of interleaved bottom plates 14 or fingers. There are also several undesirable parasitic capacitances in the DAC 10. The first parasitic capacitance is shown as $C_u$ between the bottom plate 14 and the top plate 12. The next parasitic capacitances are between the bottom plate 14 and the fingers on either side and are shown as $C_{p1}$ and $C_{p2}$. The final parasitic capacitance is between the bottom plate 14 and the substrate which is also ground and is shown as $C_{p3}$. Thus, $C_{btm}$ is the sum of $C_{p1}$ and $C_{p2}$ and $C_{p3}$.

Figure 3:
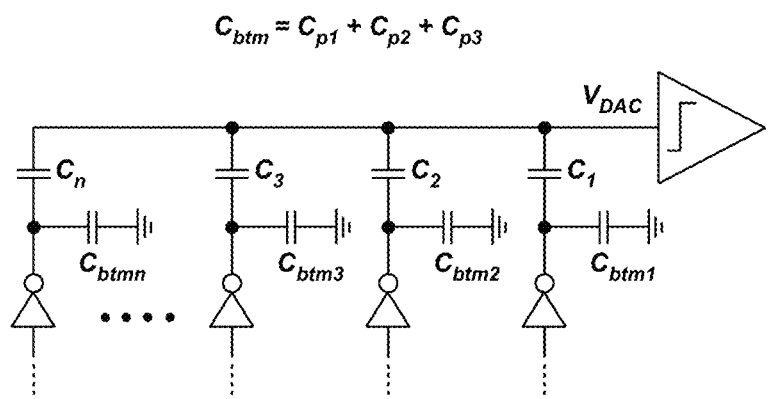
FIG. 3 is a circuit diagram that represents the parasitic capacitances shown in FIG. 2.

FIG. 3 is a circuit diagram that represents the parasitic capacitances shown in FIG. 2.

As will be shown, the first embodiment improves power efficiency and speed of the DAC by grouping capacitors in a symmetrical structure thereby reduce the parasitic bottom $C_{p3}$ by threefold while also rejecting odd-order process gradient.

In addition, the ADC of the first embodiment demonstrates a "dualpath" bootstrapped switch to increase the sampling spurious-free dynamic range (SFDR) by more than 5 dB over the prior art by decoupling the critical signal path from the nonlinear parasitic capacitance with virtually no hardware overhead.

Using the system above and other low-power, high-speed techniques, the first embodiment of the SAR ADC obtains a single-channel speed of 1.25-GHz without the need for pipelining. Implemented in a standard 28-nm CMOS process, the ADC uses only 8× time-interleaving to achieve an overall sampling rate of approximately 10 GHz and a signal-to-noise-and-distortion ratio (SNDR) of 36.9 dB at Nyquist while consuming approximately 21 mW. The figure-of-merit (FoM), at 37 fJ/conv.-step, may be the best among state-of-the-art ADCs with similar speeds.

A first improvement in the first embodiment of the invention is to use constant-matching scaling. Although it is appealing to reduce the DAC size to thermal limits for high speed and low power, the minimum size in low to medium-resolution SAR ADCs is typically limited by the capacitor matching.

For example, for an 8-bit ADC and an 800-mVpp differential input, the kT=C noise requirement dictates a lower bound of about 10 fF for a DAC, a small value that is difficult to achieve the required matching. This fundamental trade-off between capacitance and matching typically compels low to medium-resolution ADCs to size their DACs larger than the kT=C limit. To improve matching without the penalty of increased capacitance, the first embodiment scales both the capacitor parallel plate area and spacing as shown in FIG. 4.

Figure 4:
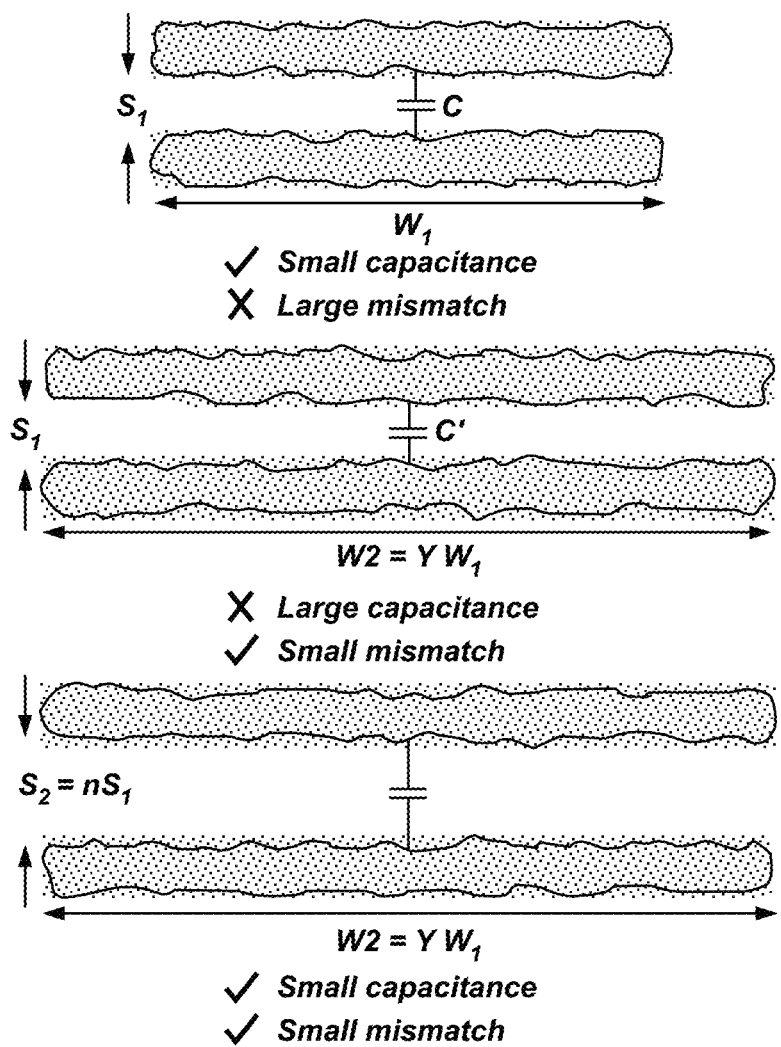
FIG. 4 is a series of circuit diagrams that demonstrate an optimized small capacitance and small mismatch.
Figure 5:
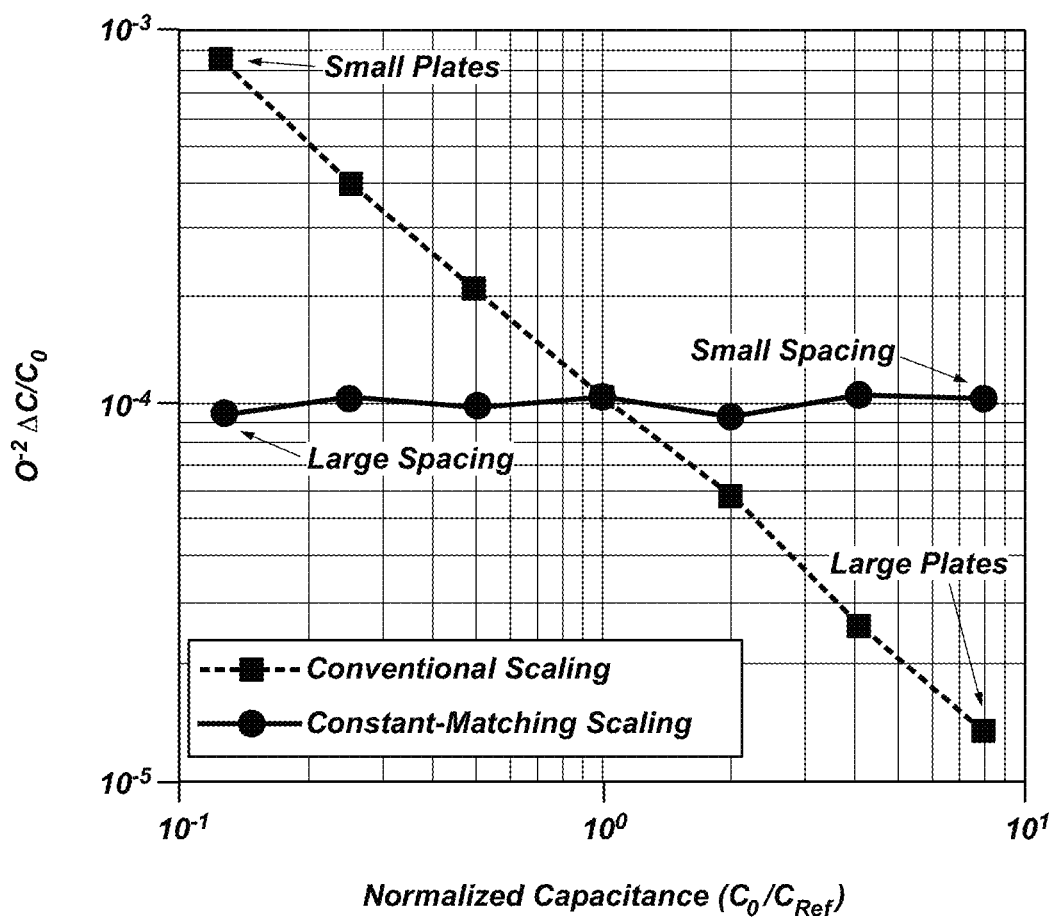
FIG. 5 is a graph showing conventional scaling (vary plate size; constant spacing) and constant-matching scaling (vary spacing; constant plate size) from geometrical simulations.

FIG. 4 shows that when both the area and spacing are increased, the new capacitor enjoys simultaneous small capacitance and good matching. Geometrical simulations confirm that when a capacitor is scaled along only area or only spacing, the former alters the matching while the latter maintains a constant matching as shown in FIG. 5.

This trend is consistent with the measurement results. Thus, to achieve good matching with small capacitance, the lateral metal-oxide-metal (MoM) unit capacitor in the ADC uses 2× the minimum design-rule spacing between the top and bottom plates, and the minimum metal width to reduce the unit capacitance to approximately 0.25 fF. This yields a total single-ended DAC capacitance of about 32 fF for 8-bit matching.

A second improvement in the first embodiment of the invention is to use grouped DAC capacitors. While much effort has been spent on reducing the unit capacitance in SAR ADCs, little attention has been paid to the DAC bottom-plate parasitic capacitance, which has a significant impact on both the speed and power of the ADC. Defining the ratio of the bottom-plate capacitance of a unit capacitor to the unit capacitance as the parasitic factor $\alpha = C_{btm}/C_u$, it can be shown that a binary DAC exhibits a settling time of:

$$t_s = (i+1) R_u C_u [\alpha + C_{top}/(2^n C_u + C_{top})] \ln 2 \qquad \text{Equation 1}$$

where I is the bit of the capacitor switched, Ru is the equivalent output resistance of a unit DAC driver, n is the number of bits for the DAC, and $C_{top}$ is the DAC top-plate parasitic capacitance. While a typical, well-designed MoM capacitor utilizing upper metal layers exhibits a parasitic factor $\alpha$ of <5%, when the capacitor is placed in a finger DAC, $\alpha$ may dramatically increase to higher than 100%. A large $\alpha$ significantly prolongs the settling time according to Equation 1, posing a serious problem in high-speed ADC.

Figure 6:
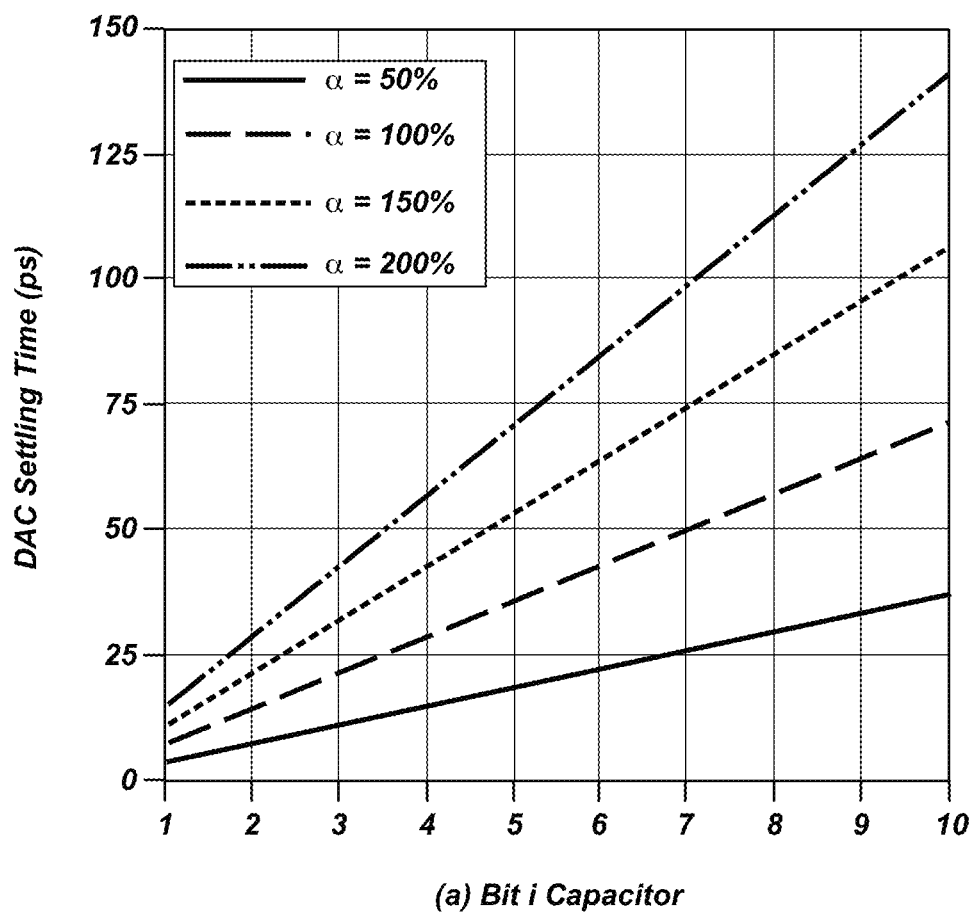
FIG. 6 is a graph the DAC settling time versus the bit capacitor switched for different $\alpha$'s.

FIG. 6 plots the DAC settling time versus the bit capacitor switched for different $\alpha$'s. As expected, $t_s$ increases with both a larger $\alpha$ and higher-bit capacitors.

The grouped-capacitor DAC shown in FIG. 2 illustrates an implementation of a DAC using a lateral comb structure, where only three unit capacitors are shown. The bottom plate of the unit capacitor $C_u$ suffers from parasitic capacitance to the neighbors ($C_{p1}$ and $C_{p2}$) and to the substrate ($C_{p3}$). Because the DAC is typically implemented using upper-layer metals, the distance from the bottom plate to the substrate is much larger than the distance from the bottom plate to the neighboring capacitors.

Furthermore, the length L1 of the bottom-plate metal outside of the U-shaped region may be much longer than the length L2 inside the region so as to keep the irregular bit bus routing (not shown) away from the unit capacitors to minimize mismatch.

For example, the L1-to-L2 ratio may be more than 3:1. Due to these factors, each of $C_{p1}$ and $C_{p2}$ may be an order of magnitude larger than $C_{p3}$, resulting in $\alpha=(C_{p1}+C_{p2}+C_{p3})/C_u$ that easily exceeds 100%. This is in contrast to a single unit capacitor in isolation where $\alpha=C_{p3}/C_u$ is typically <5%.

For high-speed designs, it may be desirable to seek to minimize $\alpha$ so as to reduce the DAC settling time and to minimize the DAC driver loading. Recognizing that the large $C_{p1}$, $C_{p2}$ is a consequence of interleaving the unit capacitor of the same bit capacitor throughout the DAC, the capacitors placement may be modified from the conventional interleaved scheme to the "grouped" scheme.

Figure 7:
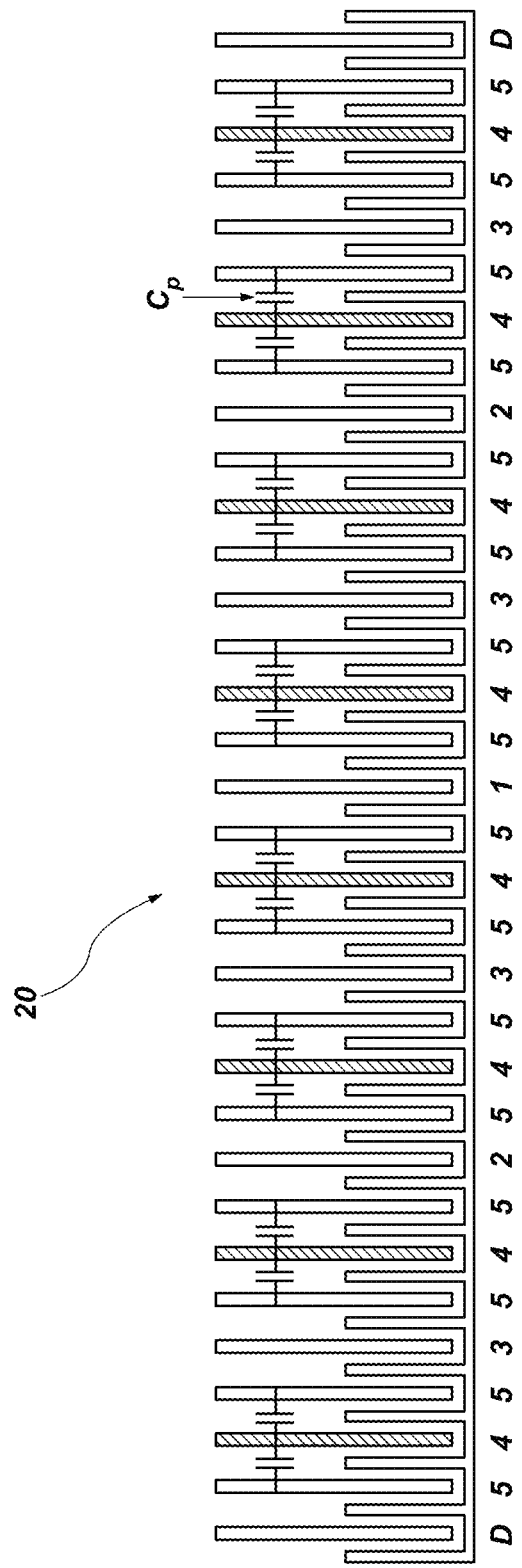
FIG. 7 is a prior art DAC with a total of 5 bits being shown.

Accordingly, the prior art arrangement of a DAC 20 is shown in FIG. 7 with the smallest bit being bit 1 at the center of the DAC. FIG. 7 highlights the capacitors of bit 4. As can be seen, there is a lateral parasitic capacitance $C_p$ between each of the bit 4 capacitors and the capacitors to either side.

The structure of the DAC 20 for the bits is a progression by powers of 2, or 1, 2, 4, 8, and 16 unit capacitors for the first 5 bits that are shown on this DAC. Bit 1 is disposed at the center of the DAC 20, and subsequent bits are evenly divided on each side of bit 1. A unit capacitor is defined as the number of wires or interleaved fingers that are in the bit.

Bit 1 is comprised of 1 unit capacitor and has two parasitic neighbors, one on each side. Bit 2 is comprised of 2 unit capacitors with 4 parasitic neighbors. Bit 3 is comprised of 4 unit capacitors with 8 parasitic neighbors. Bit 4 is comprised of 8 unit capacitors with 16 parasitic neighbors. Finally, bit 5 is comprised of 16 unit capacitors with 32 parasitic neighbors. It should be obvious from this progression that the higher the number of the bit, the greater the number of lateral parasitic capacitances. All of these parasitic capacitances increase the power usage and reduce the speed of the DAC 20.

Figure 8:
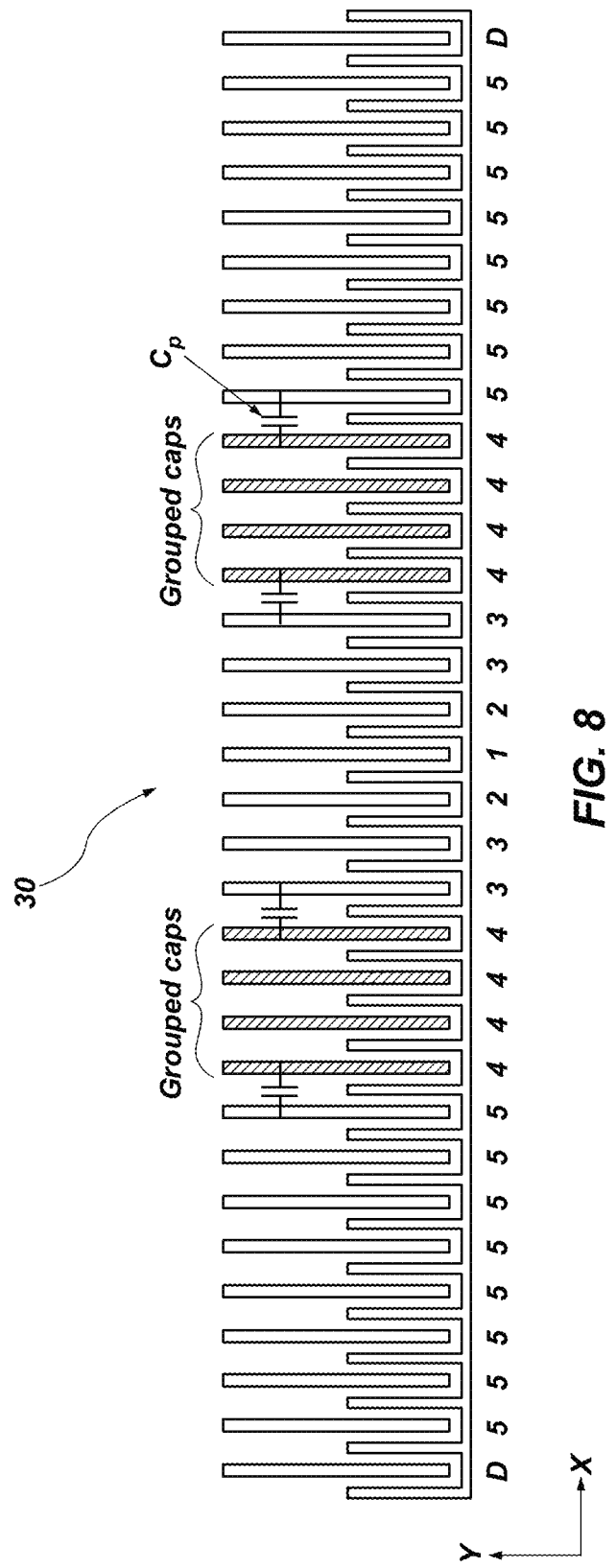
FIG. 8 is the DAC of the first embodiment showing groups of capacitors for each bit.

In contrast, the first embodiment of the DAC 30 is shown in FIG. 8. It is understood that there are more bits in a DAC than the capacitors of the 5 bits shown. It is only the limitations of the size of the example shown that are the limiting factor for the number of bits in the DAC 30. The higher bits would be added to both the left and the right ends of the DAC 30. This figure also shows the grouping of the bits. In this figure, bit 4 is again highlighted in two separate groups on either side of bit 1.

An important feature of the first embodiment is that the grouping of bits has a substantial effect on the parasitic capacitances on the bits. For example, bit 4 goes from having 16 parasitic neighbors to only 4. Thus, bit 1 has two parasitic neighbors, bit 2 has four parasitic neighbors, and all subsequent bits also have just four parasitic neighbors. This substantial reduction in the number of parasitic neighbors for all bits great than 2 results in a substantial decrease in power usage and an increase in speed of the DAC 30.

Thus, in the first embodiment of the invention, the unit capacitors belonging to the same bit are grouped together in the DAC 30 instead of being interleaved throughout the length of the DAC. This greatly reduces the lateral parasitic capacitance because only the unit capacitors at the two ends of a group see the neighboring capacitors.

It can be shown that the total lateral parasitic capacitance $C_{p,tot}$ in a DAC 30 of the first embodiment is $[4(n-1)+2]C_p$, where n is the number of bits and $C_p$ the unit lateral parasitic capacitance.

Figure 9:
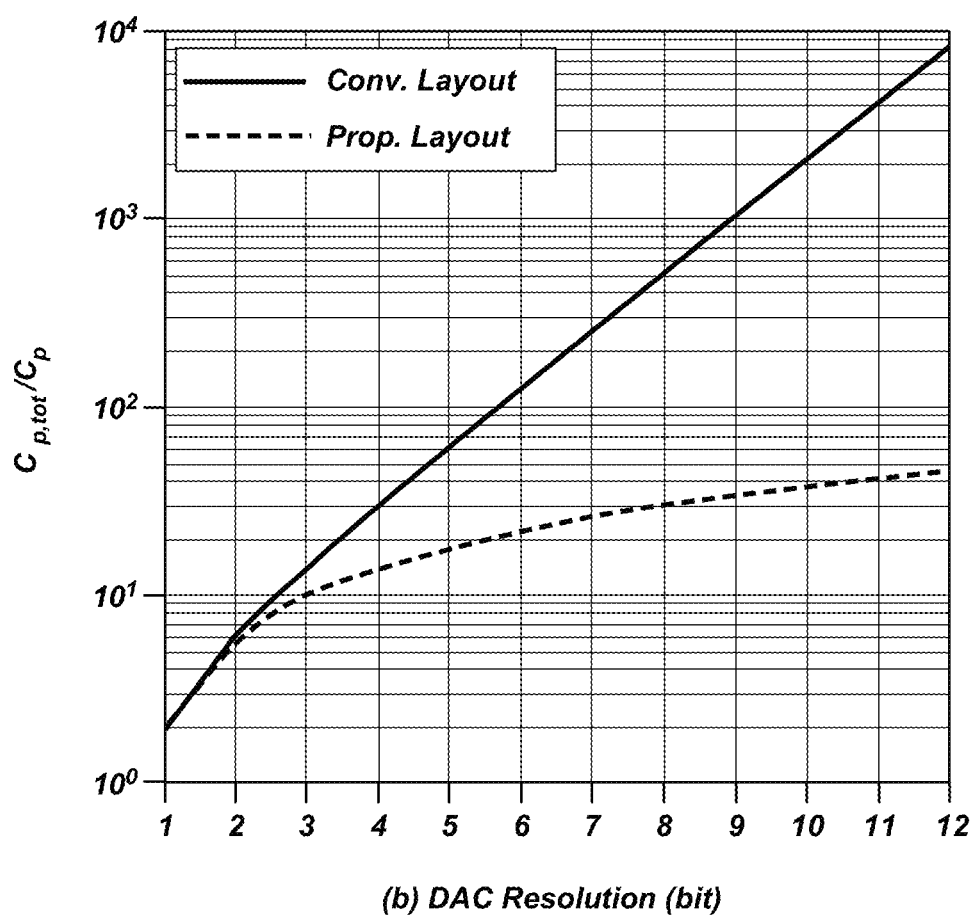
FIG. 9 is a graph of $C_{p,tot}$ normalized to $C_p$ versus n for the prior art and grouped-capacitor layouts.

FIG. 9 plots $C_{p,tot}$ normalized to $C_p$ versus n for the conventional (prior art) and proposed (grouped-capacitor) layouts of the first embodiment. While $C_{p,tot}/C_p$ increases exponentially with the DAC resolution in the prior art layout of FIG. 7, it increases only linearly in the first embodiment shown in FIG. 8, resulting in dramatic capacitance savings as the resolution exceeds a few bits.

For example, for n≥6, the capacitance savings are over 80%, making the first embodiment attractive for high-speed designs. For the first embodiment of the SAR ADC, extracted layout shows that with the prior art design, the total bottom-plate parasitic capacitance including the bit line routing is 42 fF, which is greater than the DAC capacitance itself (32 fF). With the DAC 30 of the first embodiment, the total bottom-plate capacitance reduces by threefold to only 14 fF, thereby significantly reducing power and increasing the speed of the SAR ADC.

Another issue of the DAC that must be addressed is the effect of gradient on matching. The process gradient may be defined as the gradient that is produced over the length of a DAC. The process gradient is like an error that occurs because when a capacitor such as a DAC is fabricated, it will never be perfect. There is always some sort of gradient where the capacitance on the left side of the DAC is larger and the capacitance on the right is smaller. Interestingly, the process gradient tends to even out over the length of the DAC in the prior art.

In contrast, the first embodiment of the invention that uses grouping of the unit capacitors by bit may actually be more sensitive to the process gradient. However, experimentation has shown that the increased sensitivity does not appear to affect the performance of the DAC.

Figure 10:
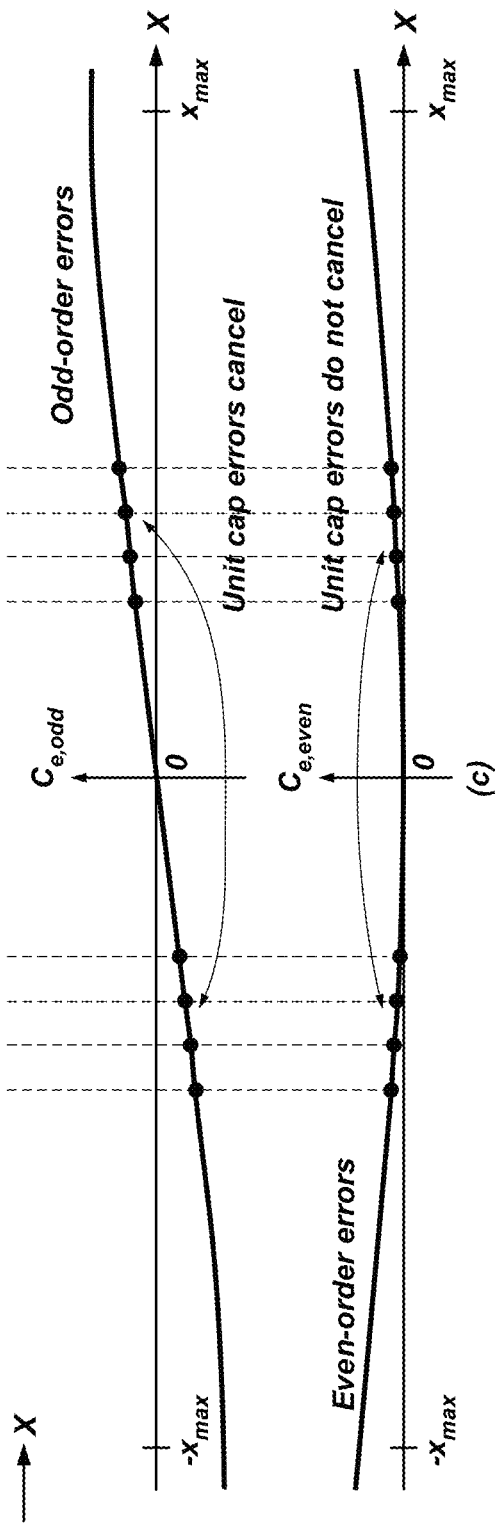
FIG. 10 is a graph of unit capacitor errors for bit 4 capacitors due to $C_{e,odd}$ and $C_{e,even}$ in the first embodiment.

FIG. 10 is provided in order to explain what is happening in the first embodiment. In general, a process gradient may be decomposed into x and y components with respect to the DAC as shown in FIG. 10. Since the y-component gradient affects all unit capacitors equally, it does not cause mismatch and may be ignored. On the other, hand, for the x-component affects each unit capacitor differently. It is possible to express the unit capacitor's error Ce due to the x-component gradient normalized to the unit capacitance Cu using an nth-order polynomial:

$$C_e/C_u = a_0 + a_1\tilde{x} + a_2\tilde{x}^2 + a_3\tilde{x}^3 + \ldots + a_n\tilde{x}^n, \qquad \text{Equation 2}$$

where $\tilde{x}=x/x_{max}$ is the distance between the unit capacitor of interest and the center of the DAC normalized to the maximum x dimension of the DAC. In both the prior art and the first embodiment, the DAC places the unit capacitors of a bit capacitor symmetrically to the center of the DAC, thus cancelling out the odd-order error terms in Equation 2 as illustrated in the top graph of FIG. 10 which shows that the negative errors cancel out the positive errors. Furthermore, the DC error (a0) does not introduce mismatch as it affects all unit capacitors equally, and the fourth and higher-order errors are negligible in typical processes over practical DAC dimensions. This leaves only the second-order error as the dominant mismatch contributor.

It is possible to calculate the error of each bit capacitor by summing the second-order errors from its constituent unit capacitors, then normalizing the sum to the ideal bit capacitor value. For the first embodiment of the invention, the normalized error for the bit I capacitor is:

$$\hat{C}_{e,prop}(i) = a_2 2^{4-2n-i} \sum_{k=0}^{2^{i-2}-1} (2^{i-2}+k)^2 \quad \text{Equation 3}$$
$$= a_2 2^{1-2n} \{2^{2i-3} + (2^{i-2}-1)[2^{i-1} + (2^{i-1}-1)/3]\}$$

In the first embodiment, the errors are small for the lower-bit capacitors and large for the higher-bit ones. This is because the prior art distributes the unit capacitors of a bit capacitor throughout the DAC, making the errors across the bit capacitors relatively uniform. In contrast, the first embodiment groups the higher-bit capacitors near the two ends of the DAC. Hence, the higher-bit capacitors may suffer larger errors due to the parabolic profile of the second-order error as shown in the bottom graph in FIG. 10.

The capacitor errors found above cause differential non-linearity (DNL) which may be calculated as:

$$DNL(j) = \sum_{k=1}^{n} 2^{k-1} [b_{j+1}(k) - b_j(k)] \hat{C}_e(k) \quad \text{Equation 4}$$

where n is the DAC resolution $b_{j+1}(k)$ and $b_j(k) \in (0,1)$ are the kth bit of code j+1 and code j, respectively, and $C_e$ is given by Equation 3. Due to the grouped capacitors, the first embodiment has a larger differential nonlinearity (DNL) than the prior art.

Figure 11:
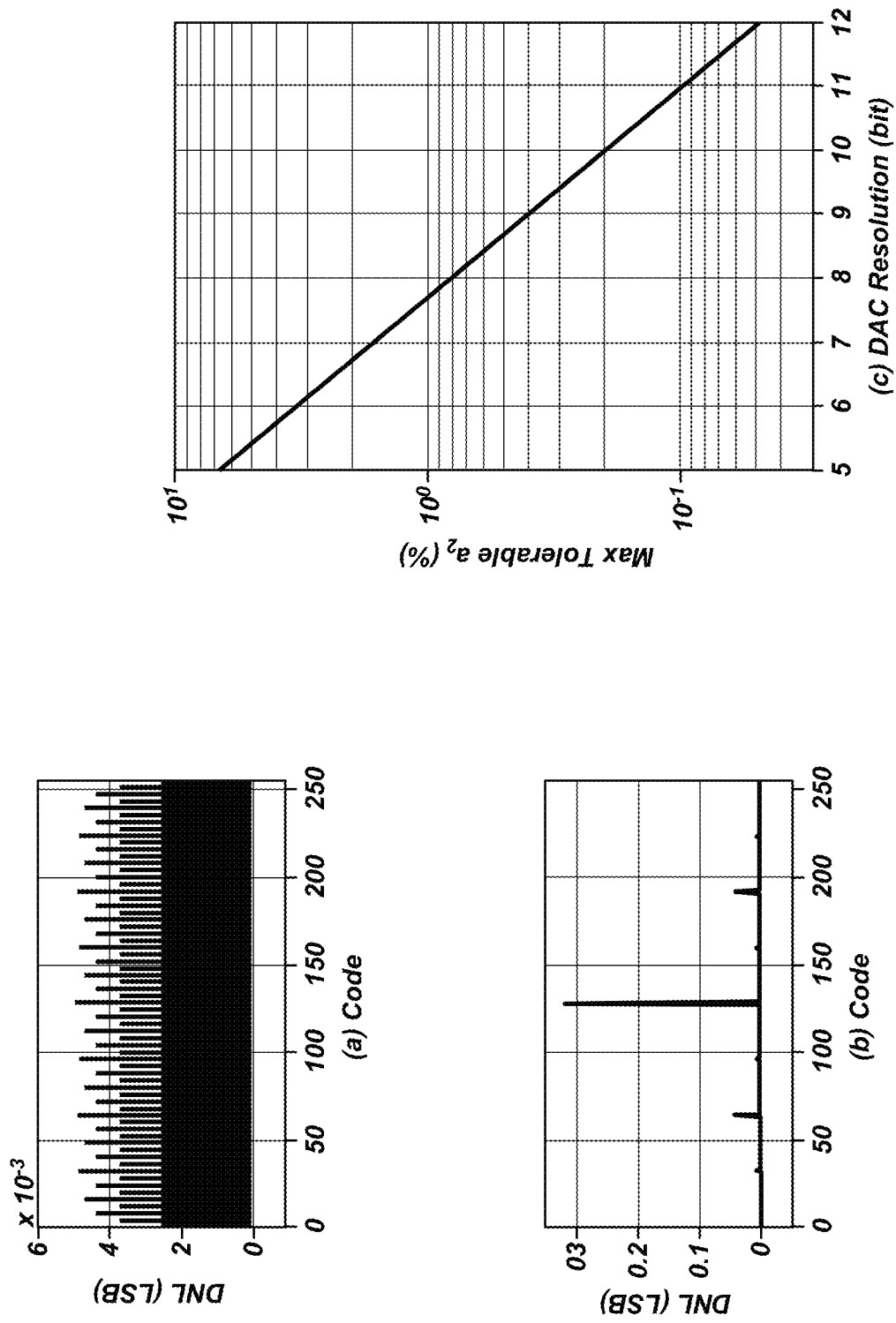
FIG. 11 is a plot of differential nonlinearity (DNL) for prior art and first embodiment DAC layouts, and the maximum tolerable $a_2$ versus DAC resolution.

FIGS. 11A and 11B plot the DNL for the two layouts for n=8 and $a_2$=0.5%, showing that the worse-case DNL occurs at the mid-scale transition for both. Due to the grouped capacitors, the first embodiment has a larger DNL than the prior art. FIG. 11C plots the maximum tolerable $a_2$ that keeps the worst-case DNL<½ least-significant-bit (LSB) for different DAC resolutions for the first embodiment.

As the resolution increases, the requirement for $a_2$ becomes more stringent. For instance, $a_2$ must be less than 0.79% for an 8-bit DAC and less than 0.2% for a 10-bit one. Based on experimental measurement results, the ADC of the first embodiment exhibits no distinct DNL at the mid-scale transition, suggesting that $a_2$ over the DAC's 22-μm length falls well below the maximum tolerable value. Similarly, the 10-bit ADC employs a 300-μm grouped-capacitor DAC and it shows no major DNL at the mid-scale transition either. Thus, $a_2$ may be quite small in typical processes over practical DAC dimensions, making random mismatch rather than gradient the dominant error source. In such cases, grouped-capacitor layout of the first embodiment may be safely used to aggressively reduce the bottom-plate parasitic capacitance without incurring mismatch.

The next improvement of the first embodiment relates to scaling. The monotonic switching scheme lends itself nicely to simple and low-power SAR logic suitable for high-speed designs, but it causes the DAC common mode to vary over the sample conversion, incurring dynamic comparator offset. Therefore, the switching scheme is modified so that the most-significant-bit (MSB) switching moves the DAC common mode in the opposite direction to the subsequent LSB switching's.

Near the end of the conversion, the common mode returns to about the same value as the beginning. Errors caused by the common-mode variations in the middle bits are tolerated by the DAC redundancy, where the bit capacitors $C_{1-8}$ are scaled by a radix of approximately 1.78.

In other words, the prior art teaches scaling by a factor of 2. However, the first embodiment does not factor by a scale of 2 in order to obtain redundancy. Redundancy helps the first embodiment to tolerate dynamic errors when the DAC is switched. The first embodiment expects to see a large number of dynamic errors because of the operating speed of the DAC which is approximately 10 GHz. Redundancy may enable the first embodiment to tolerate the dynamic errors and recover from them quickly.

A direct implementation of the non-integer-radix DAC would result in fractional caps as shown in FIG. 12, making it difficult to achieve good matching. The DAC of the first embodiment "quantizes" the bit capacitors to integer multiples of Cu to simultaneously obtain redundancy and good matching. The DAC redundancy additionally offers tolerance to other dynamic errors such as incomplete DAC settling, comparator kickback, and nonlinear DAC top-plate capacitance.

The quantized capacitor scaling of the first embodiment offers a systematic procedure to derive the weight of each bit capacitor. Because there is no DAC switching prior to the MSB comparison, the MSB decision does not suffer from incomplete DAC settling. Thus, some of the MSB redundancy is redistributed to the lower bits by using a smaller radix in the MSBs than the LSBs to utilize redundancy more effectively. This may be seen in FIG. 12 where a constant radix 1.78 results in 30.5 LSB of redundancy at the MSB, whereas after redundancy redistribution, it is reduced to 15 LSB and the lower-bit redundancies are all increased.

Figure 13:
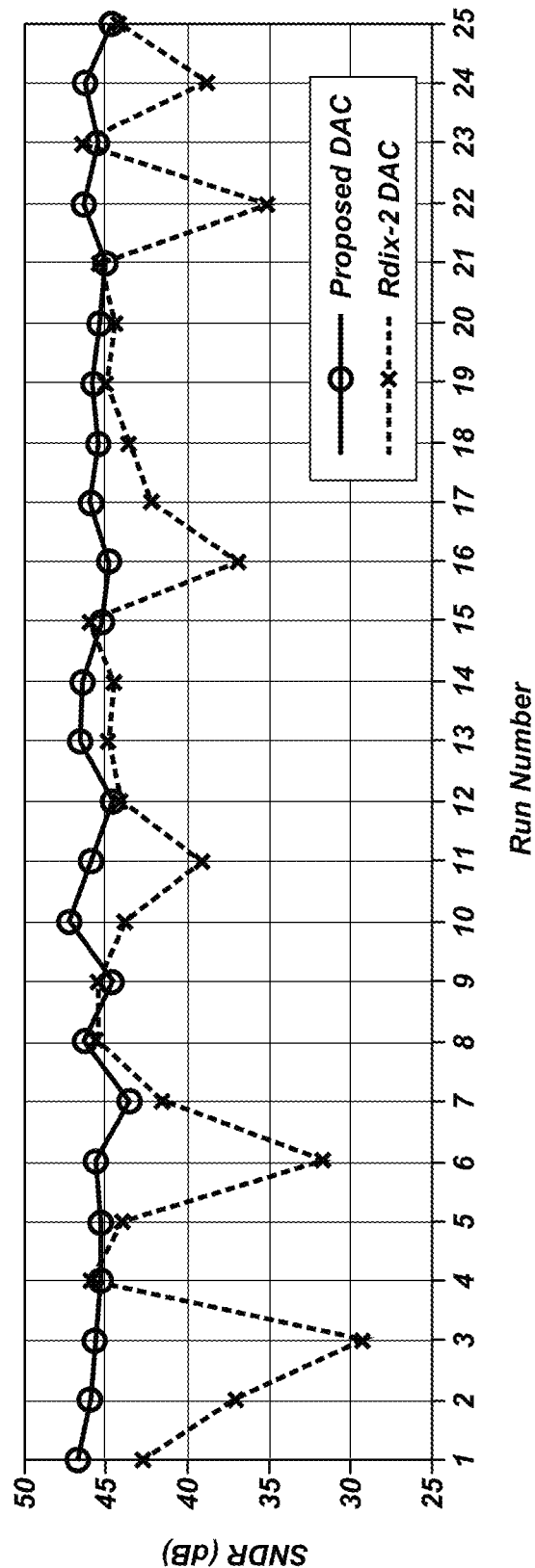
FIG. 13 is a graph of Monte Carlo simulations of SNDR versus run number for ADCs using radix-2 DAC and the first embodiment quantized sub-radix-2 DAC.

FIG. 13 compares the SNDR from Monte Carlo simulations of the 10-GHz ADC utilizing the DAC of the first embodiment and the prior art radix-2 DAC. Owing to the redundancy, the ADC with the DAC of the first embodiment maintains a stable SNDR of around 46 dB while the prior art can drop as low as 29 dB due to the aforementioned dynamic errors.

Figure 14:
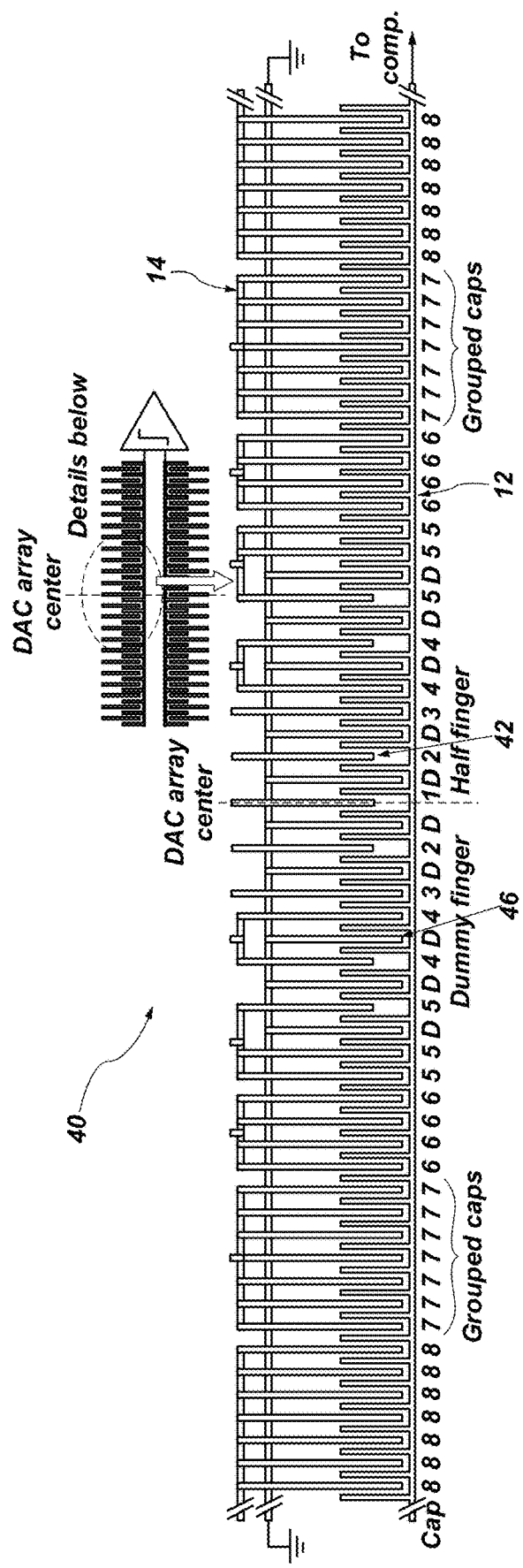
FIG. 14 is another DAC 40 of the first embodiment that uses bit grouping as well as half fingers and dummy fingers in the bottom plates 14.

FIG. 14 illustrates the detailed layout of the final DAC 40 of the first embodiment. A significant feature of the final DAC 40 is the use of half fingers 42 as capacitors. The half fingers 42 may have only half the capacitance of a full finger 44.

It is first noted that the DAC 40 is fully symmetrical and employs the quantized, sub-radix-2 layout with grouped capacitors and non-minimum spacing between the top plate 12 and bottom plates 14. Half finger 42 capacitors may further reduce the 2× dimension to thereby minimize the effect of process gradient.

Note that dummy fingers 46 may also be inserted next to any half fingers 42 so as to prevent a half finger from inducing mismatch in its adjacent full fingers 44. The first embodiment of the final DAC 40 differs from the prior art by using a single replica of the grouped structure as well as redundancy to achieve 2× better parasitic reduction while tolerating dynamic errors to increase the speed from MHz to GHz. The DAC 40 groups the capacitors but does not use a symmetrical layout, hence it is sensitive to both even and odd-order gradient errors.

The first embodiment of the present invention also includes a dual-path bootstrapped switch. At Nyquist, each 1.25-GHz channel in the 10-GHz ADC must sample a 5-GHz input in less than 100 ps while achieving about 60 dB of SFDR, a daunting linearity requirement for the sampling switches. While the bootstrapped switch of the prior art shown in FIG. 15A and its equivalent circuit shown in FIG. 15B is widely used for linear sampling, its non-idealities become more pronounced at high speeds, thus seriously degrading the linearity.

Ideally, $V_{GS}$ of the sampling transistor $M_{sw}$ is constant and independent of the input so as to afford a constant switch on-conductance $G_{sw}$. Owing to the bootstrapping capacitor $C_{bt}$, the internal node $V_x$ rises to approximately $V_{in}+V_{DD}$ to boost the gate voltage of the switch transistor during the sampling phase.

To prevent forward biasing the source-bulk junction of the PMOS transistors $M_1$ and $M_2$, their bulk terminals are tied to the source instead of $V_{DD}$. But the N-well that contains both $M_1$ and $M_2$ adds a large nonlinear capacitance $C_{nwell}$ to the $V_x$ node. Consequently, during sampling, $C_{nwell}$ modulates the voltage $V_X$, which in turn modulates $M_2$'s on-conductance $G_2$. The nonlinear $C_{nwell}$ and $G_2$ modulate the sampling transistor's gate voltage $V_G$, reducing the sampling linearity.

FIG. 16A shows the equivalent circuit of the bootstrapped switch during sampling for the first embodiment. The voltage transfer function from $V_{in}$ to $V_G$ may be found as $$V_G/V_{in}=C_{bt}[sR_2C_G(C_{bt}+C_{nwell})+C_{bt}+C_{nwell}+C_G]^{-1} \quad \text{Equation 5}$$

where $R_2=1/G_2$ and $C_G$ is the capacitance seen at the gate of $M_{sw}$. Assuming the bandwidth of the bootstrapping circuit is much larger than the input frequency, i.e. $1/(R_2CG)\gg w_{in}$, it can be shown that the phase shift of $V_G/V_{in}$ is approximately $$\Phi=w_{in}R_2C_G[1+C_G/(C_{bt}+C_{nwell})]^{-1} \quad \text{Equation 6}$$

The key point is that due to the nonlinear (and therefore, time-varying) $R_2$ and $C_{nwell}$, $\Phi$ inevitably becomes time-varying, thus distorting VG. The distorted VG then modulates $G_{sw}$ causing sampling nonlinearity. While increasing the size of $C_{bt}$ may improve the linearity by overwhelming $C_{nwell}$ in Equation 4, a large $C_{bt}$ increases the turn-on time of the sampling switch, which may be a serious problem given the short sampling window in the ADC.

The technique may improve the sampling nonlinearity by incorporating a "dual-path" bootstrapped switch as illustrated in FIG. 16A. This circuit evolves from the prior art circuit in FIG. 15A by splitting $M_1$ in FIG. 15A into $M_{1A}$ and $M_{1B}$, and $C_{bt}$ into $C_{btA}$ and $C_{btB}$. This forms a main signal path consisting of $M_{1A}$ and $C_{btA}$ and an auxiliary signal path consisting of $M_{1B}$ and $C_{btB}$. Then, the bulk terminals of the PMOS transistors $M_{1A}$, $M_{1B}$, and $M_2$ are connected to node VX in the axillary path. This way, the input signal propagates to the gate of the sampling switch through the main path without being directly loaded by $C_{nwell}$ while the auxiliary path drives $C_{nwell}$. The main path and the auxiliary path may then be optimized for maximum signal linearity and drive strength, respectively.

FIG. 16B depicts the equivalent circuit of the bootstrapped switch of the first embodiment during sampling. The voltage transfer function from $V_{in}$ to $V_G$ and its phase are $$V_G/V_{in}=(sR_2C_G+C_G/C_{btA}+1)^{-1} \quad \text{Equation 7}$$

$$\Phi=w_{in}R_2C_G[1+C_G/(C_{btA})]^{-1} \quad \text{Equation 8}$$

respectively. Comparing equation 8 with equation 6, it is noted that both $R_2$ and $C_{nwell}$ contribute to $\Phi$ time variance in the conventional circuit whereas only the former does in the first embodiment circuit. Furthermore, $G_2$ is more linear in the circuit of the first embodiment than in the conventional circuit because the nonlinear voltage $V_X$ is connected to the bulk of $M_2$ instead of its source terminal. Therefore, $G_2$ is proportional to the error of $V_X$ in the conventional circuit but only proportional to the square root of the error of $V_X$ in the circuit of the first embodiment.

To demonstrate the effectiveness of the solution of the first embodiment, the bootstrapped switches of the first embodiment compare their SFDR across the input frequency range. Beginning with the prior art circuit and split M1 and $C_{bt}$ to form the new circuit as described earlier. This ensures that the total width of M1 is the same between the two circuits as well as the total $C_{bt}$ for a fair comparison. All other devices have the same sizes between the two circuits.

Figure 17:
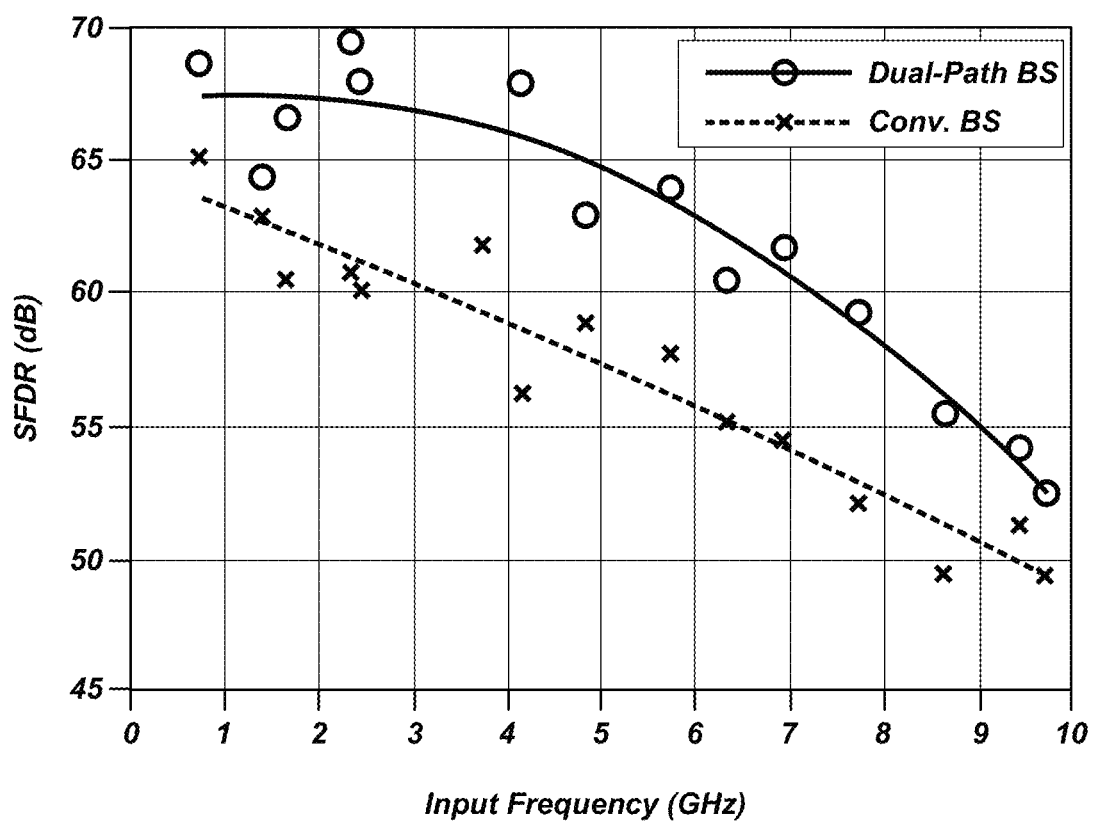
FIG. 17 is a graph of simulated bootstrapped switch SFDR versus input frequency.

In the bootstrapped switch of the first embodiment, the main-to-auxiliary device size ratio is set to 7:1. Sampling is at 1.25 GHz (single-channel speed) with a sampling window of 100 ps and a differential peak-to-peak input amplitude of 800 mV, simulations show that the prior art bootstrapped switch obtains an SFDR of about 63 dB and 57 dB with low and Nyquist-frequency inputs, respectively as shown in FIG. 17.

Owing to the improved linearity, the bootstrapped switch of the first embodiment achieves 68 dB and 65 dB at low and Nyquist frequencies, respectively, an 8-dB improvement at Nyquist over the conventional design. The bootstrapped switch of the first embodiment also demonstrates an SFDR larger than 55 dB with an input frequency as high as 9 GHz. The new bootstrapped switch also incurs virtually no hardware overhead as it entails splitting the existing devices and simple routing changes, making the linearity improvement essentially "free".

Simulations show that placing the sampling transistor Msw in a P-well and connecting the transistor's source to bulk offer no SFDR improvement as the elimination of the body effect is negated by the increased loading from the nonlinear P-well capacitance.

In time-interleaved ADCs, the problem of clock generation and distribution has often been under-appreciated and overlooked. As the number of channels increases, the area increases of the circuit, making the signal and clock routing longer. The large number of clock phases and longer routing increase the loading on the clock generator and its power consumption. In some cases, the clocking power can be comparable to the ADC core power, seriously degrading the DAC's power efficiency.

Accordingly, the first embodiment maximizes the single-channel speed to minimize the number of channels. This in turn minimizes the area, the number of clock phases, and routing distance, thereby reducing the clock generator complexity and power consumption. While a DLL-based multi-phase clock generator offers arbitrary number of clock phases, a divide-by-two-based multi-phase clock generator is significantly simpler and lower power. With a master input clock of 10 GHz, dividing by 16 (by cascading 4 divide-by-two's) yields a single-channel speed of 625 MHz, a relatively relaxed requirement for 8 bits in the 28-nm CMOS process used for construction of the SAR ADC.

However, 16 channels still occupy a substantial area and need long, complex routings, increasing the clock generator power. Therefore, the first embodiment reduces the divider ratio to only 8, yielding 8 channels with each operating at 1.25 GHz. As attaining a single-channel speed of 1.25 GHz without pipelining is nontrivial, the circuit for the SAR DAC is shown herein.

Figure 18:
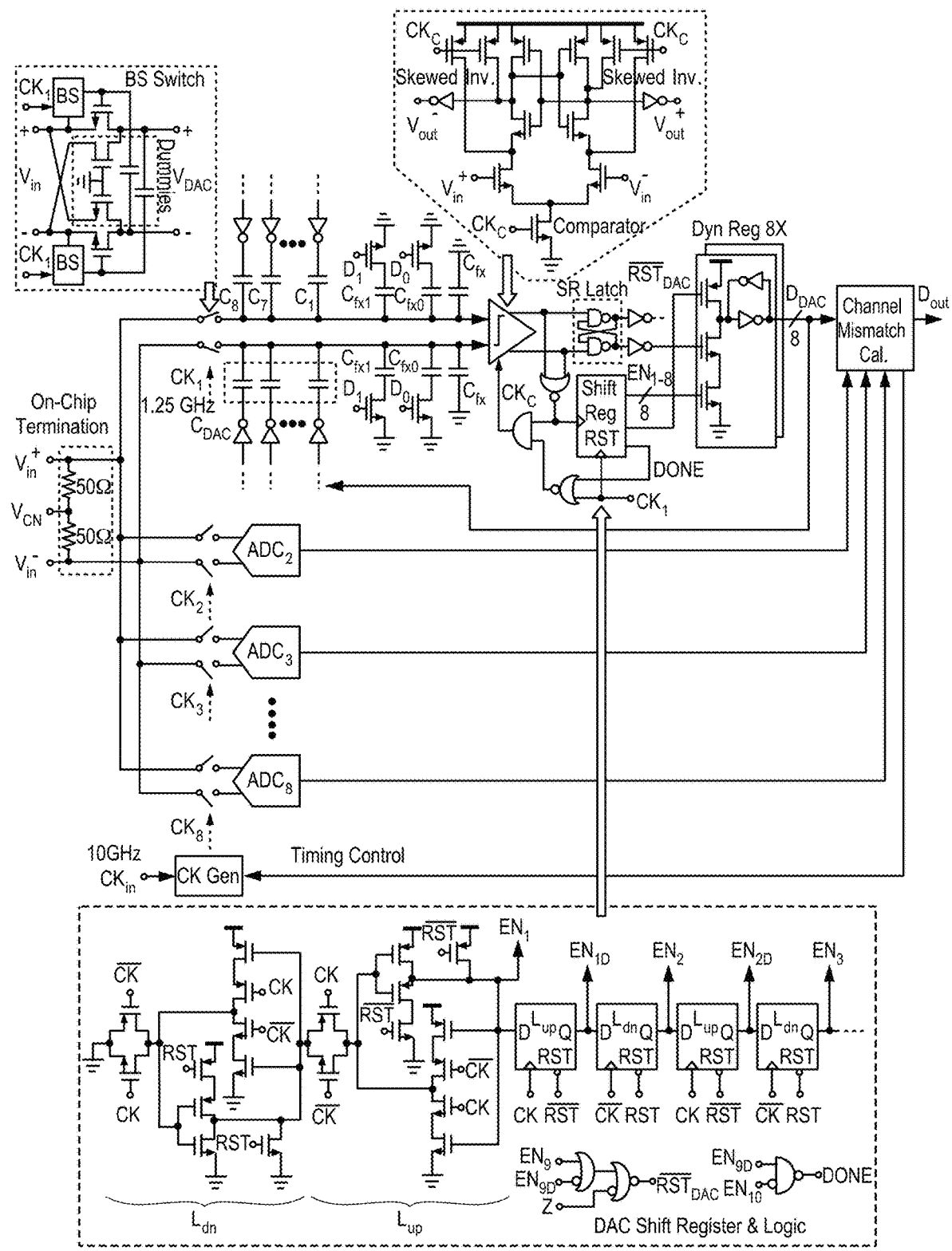
FIG. 18 is a circuit diagram of the first embodiment of a 10-GHz 8 x time-interleaved SAR ADC.

FIG. 18 shows that the ADC employs eight 1.25-GHz channels and samples the input with the distributed bootstrapped switches to avoid using a power-hungry master sample-and-hold amplifier. Each bootstrapped switch utilizes the dual-path topology presented in FIGS. 16A and 16B for high linearity, with cancellation dummies added to minimize the input feedthrough and unequal clock feedthrough.

The grouped-capacitor DAC implements the design described in FIGS. 8 and 14 to minimize both the DAC capacitance and the bottom-plate parasitic capacitance while offering redundancy for high speed. The small DAC capacitance (32 fF) makes it practical to use a fixed capacitor ($C_{fx}$) placed at the top plate of the DAC to attenuate the 1-V supply of the DAC drivers to set the differential input range to 800 mVpp, thereby obviating the need for power-hungry reference buffers.

Programmable capacitors $C_{fx0,1}$ are included at the top plate to adjust the DAC's full scale. The comparator assumes the StrongARM™ topology for high power efficiency and it is sized to meet the noise requirement. Skewed inverters at the output of the comparator favor the decision edge to minimize the comparator delay. The comparator is asynchronously clocked to reduce the sample conversion time, utilizing a NOR gate as the decision completion detector. At high speeds, the comparator outputs may not have sufficient time to reach proper logic levels, causing metastability. Accordingly, an SR latch is added after the comparator to increase gain and reduce metastability.

To decrease the logic delay, dynamic registers are used to store the comparator decisions. The dynamic registers are reset and then sequentially selected by a shift register. The dynamic register makes a high-to-low transition only if it is selected by both the enable signal (EN) and a positive comparator decision, thus realizing the reversed-MSB-monotonic DAC switching scheme. The simple scheme minimizes the logic latency for high speed. As soon as the last bit decision completes, the dynamic registers are reset by RSTDAC without waiting for the start of the next sampling period to maximize the time available for the DAC reset settling.

Figure 19:
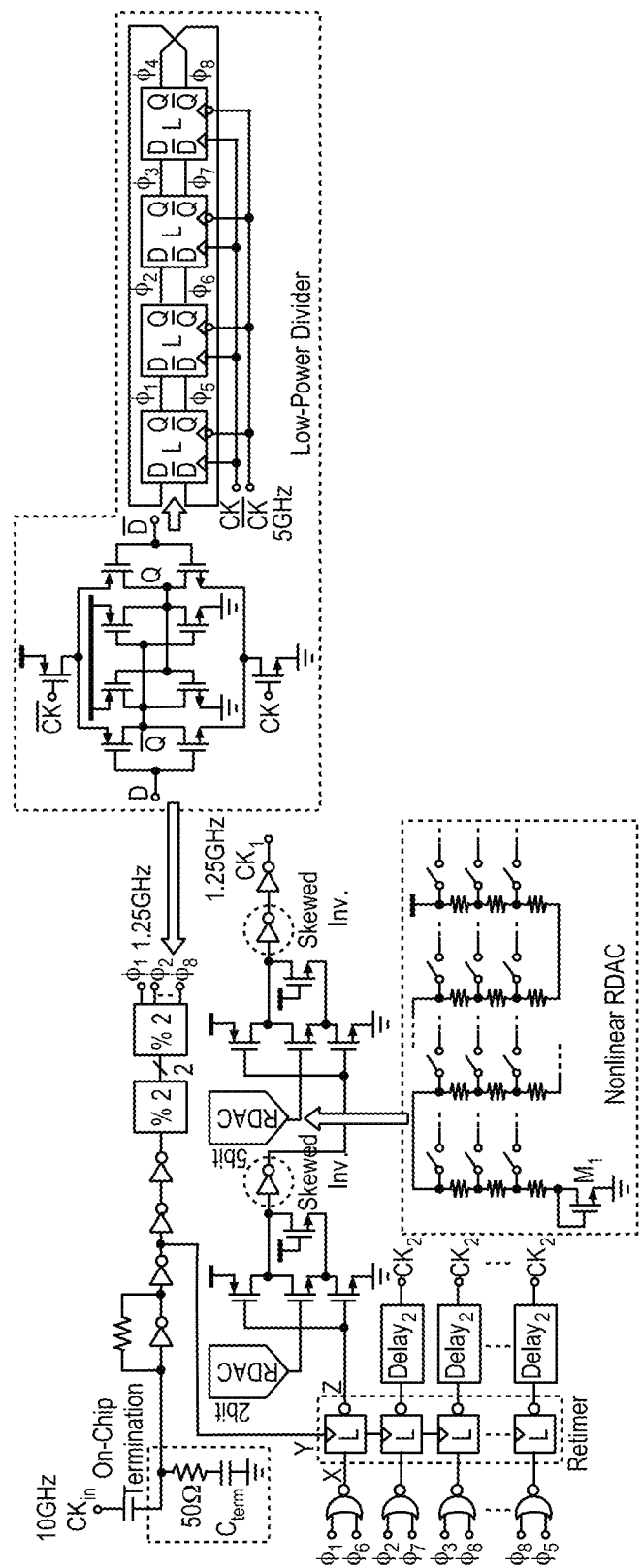
FIG. 19 is a circuit diagram of a low-power multi-phase clock generator of the first embodiment.

If for some reason the sample conversion did not finish due to metastability, the early sample clock Z shown in FIG. 19 forces all the dynamic registers to reset and initiates the DAC reset settling just prior to the start of the next sampling. The shift register consists of reset high and low latches ($L_{up}$, $L_{dn}$) clocked by the comparator decision completion detector, and the DONE signal stops the comparator clock at the end of the sample conversion. The inter-channel offset, and gain mismatches are detected by measuring each channel output's mean and variance, respectively, and corrected by adding the offset and multiplying the output with the gain mismatch factor digitally off-chip. The timing mismatch is detected by the autocorrelation method and corrected by tuning the variable clock delays for the sample clocks $CK_{1-8}$ in the clock generator.

FIG. 19 shows the clock generator circuit schematic. To reduce power consumption, the clock generator does not use any power-hungry current mode logic (CML) circuits. Instead, a self-biased inverter converts the input 10-GHz sinusoid to a square-wave. With the high clock frequency, a 50 ohm termination resistor is used on-chip instead of off-chip to improve input matching. However, a shunt resistor that is directly connected to the clock pad will disrupt the bias of the self-biased inverter.

Figure 20:
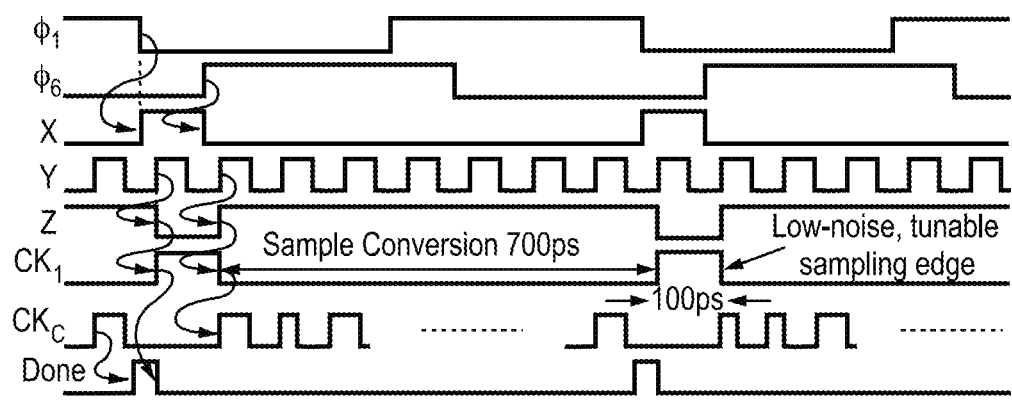
FIG. 20 is a timing diagram for the low-power multi-phase clock generator.

FIG. 20 is a timing diagram for the low-power multiphase clock generator of FIG. 19.

Fortunately, at 10 GHz it is possible to insert a capacitor $C_{term}$ of a moderate size of 55 pF in series with the 50 ohm resistor to thereby decouple the inverter's bias with negligible change to the termination impedance. A divided-by-two followed by a divided-by-four generate 1.25-GHz 8-phase clocks $\emptyset_{1-8}$, which are then converted to 12.5%-duty-cycle clocks by NOR gates, creating 100 ps for input sampling and 700 ps for sample conversion. To reduce jitter, the 1.25-GHz clocks X are re-timed using the clean 10-GHz clock Y so that noise from the dividers do not contribute to sampling jitter. This allows the dividers to be downsized considerably to thereby save power.

Variable delays adjust the phases of the 8 sample clocks $CK_{1-8}$ for timing mismatch calibration. The phase of each clock is controlled via two resistor DACs by changing the gate voltages of the NMOS transistors in the two current-starved inverters. The resistor DACs offer a total of 7 bits of programmability split between the 2 and 5-bit segments with redundancy in between. Since the delay is a nonlinear function of the gate voltage, the step sizes of the resistor DACs are nonlinear to cancel out the nonlinearity, and a footer transistor M1 excludes the cutoff region of the transistor. Each variable delay offers a delay range of 3 ps with a step size of about 26 fs.

The sampling clocks $CK_{1-8}$ are non-overlapping by skewing the inverters in the variable delay line so as to minimize coupling of the sampling clocks to adjacent channels at the moment of the sampling switch turn-off. The entire clock generator consumes approximately 1.5 mW while achieving a sampling jitter of 72 $fs_{rms}$ for an $SNR_{jitter}$ of 53 dB with a 5-GHz input.

Figure 21:
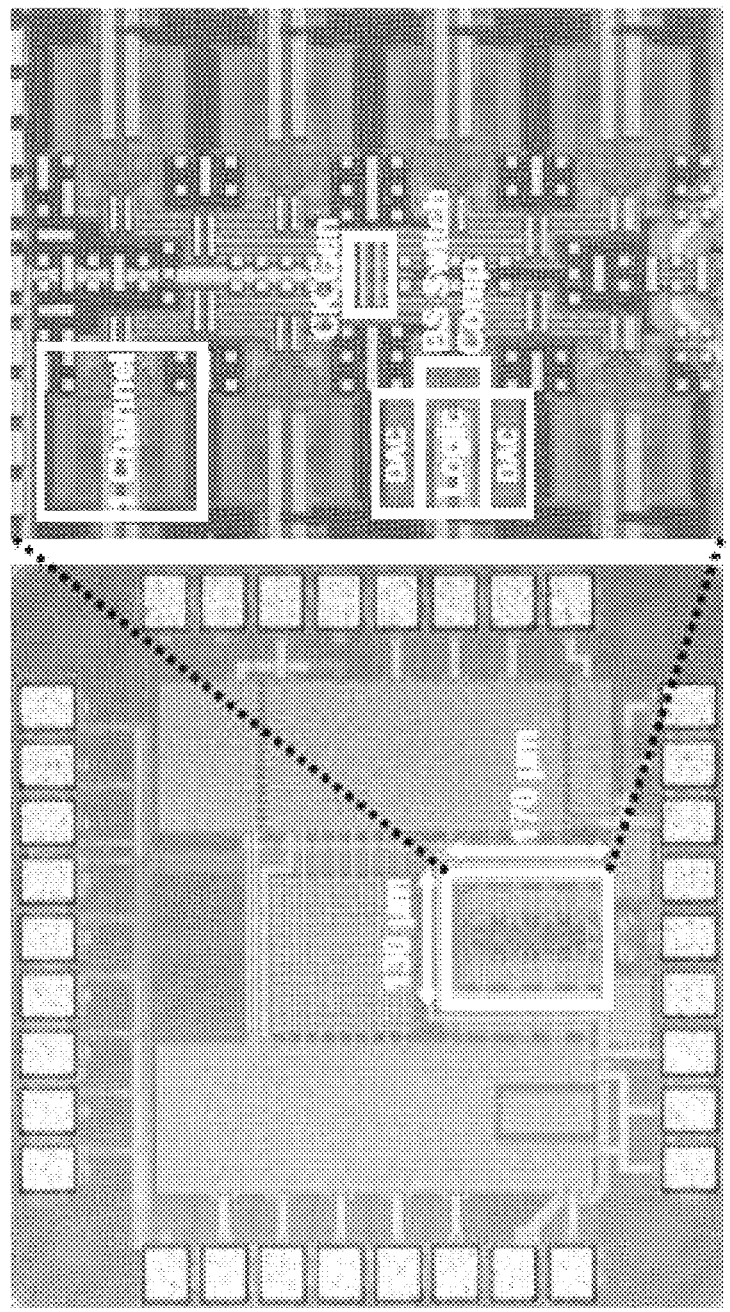
FIG. 21 is a photograph of a die for the SAR ADC.

The ADC of the first embodiment has been fabricated in a standard 28-nm CMOS process and occupies an active area of 130 μm×170 μm as shown in FIG. 21. The input and main clock are routed to the center of the ADC and then fanned out using H-trees to minimize skew. A double ground shield plane isolates the upper-metal input traces from the lower-metal clock traces. The ADC operates at 10 GHz and the output is downsampled by 2187 to facilitate testing due to the speed limitation of a logic analyzer.

Figure 22:
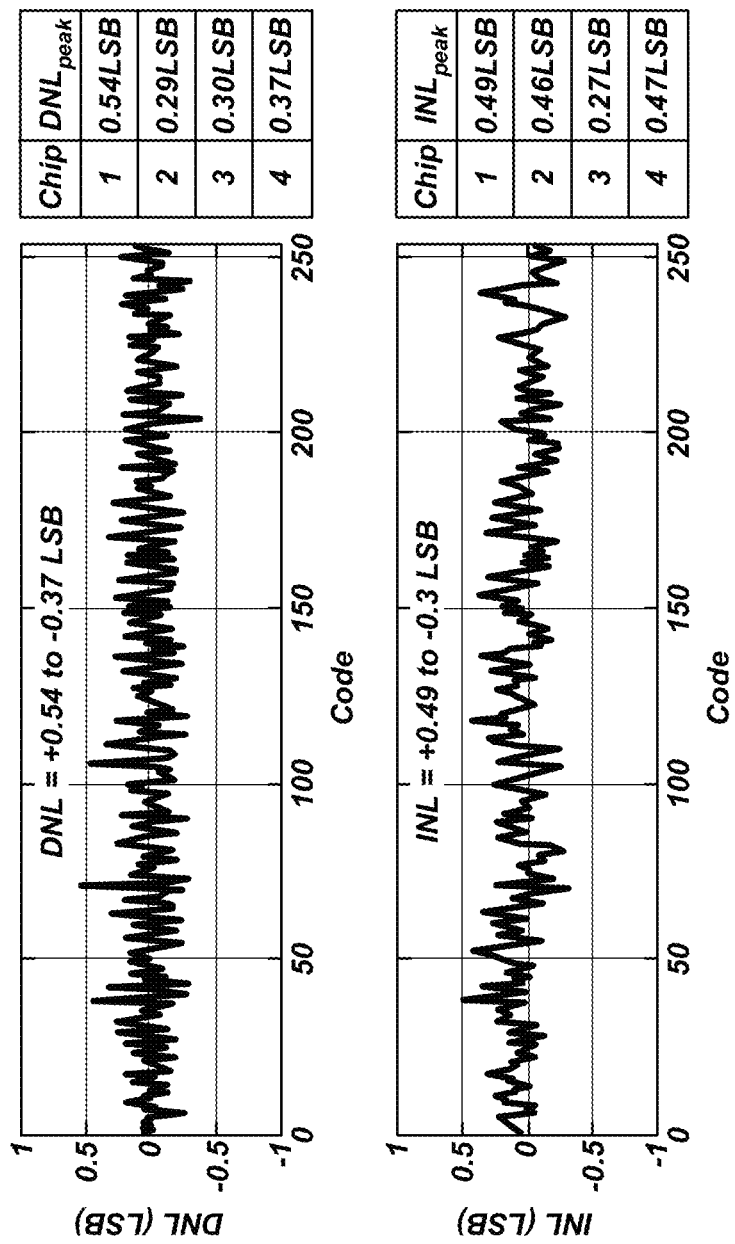
FIG. 22 is a plot that shows the measured DNL and INL from multiple chips, with the worst-case chip having peak values of 0.54 LSB and 0.49 LSB.

FIG. 22 shows the measured DNL and INL from multiple chips, with the worst-case chip having peak values of 0.54 LSB and 0.49 LSB, respectively. The DNL and INL do not exhibit any distinct jumps at the mid-scale, suggesting that the second-order process gradient is negligible for the grouped-capacitor DAC design of the first embodiment. The good DNL also suggests that the unit capacitor with constant-matching scaling successfully meet the matching requirement despite its small size of 0.25 fF.

Figure 23:
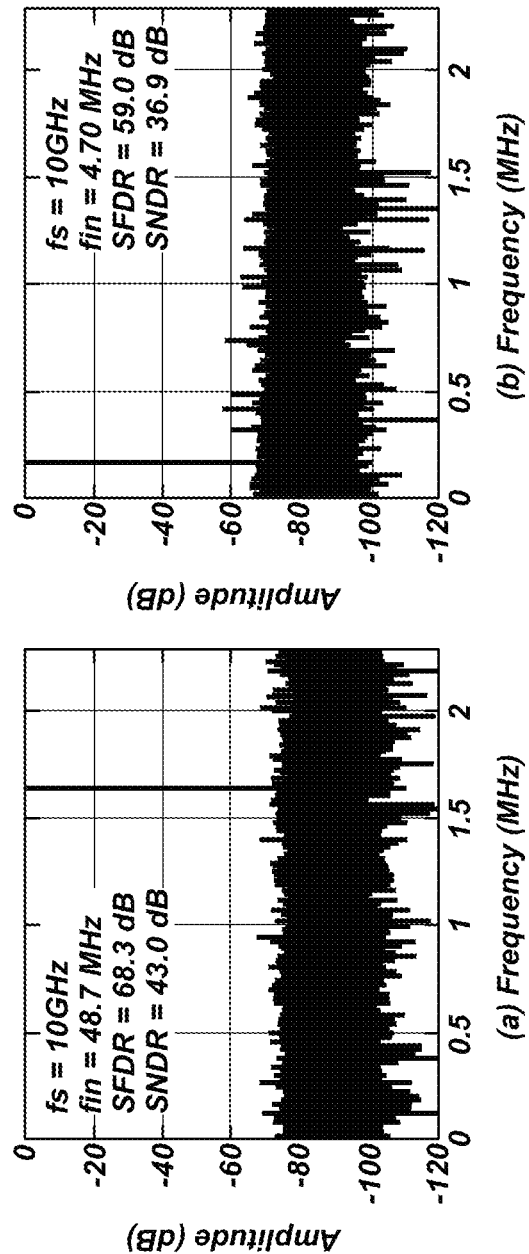
FIG. 23 is a plot that shows that the ADC exhibits a 43-dB SNDR with a near-DC input and a 36.9-dB SNDR with a Nyquist input.

FIG. 23 also shows that the ADC exhibits a 43-dB SNDR with a near-DC input and a 36.9-dB SNDR with a Nyquist input. The SNDR degradation at higher input frequencies may be due to the digital noise coupling to the clock generator through the power supply. The SFDR is 59 dB for a Nyquist input frequency.

Figure 24:
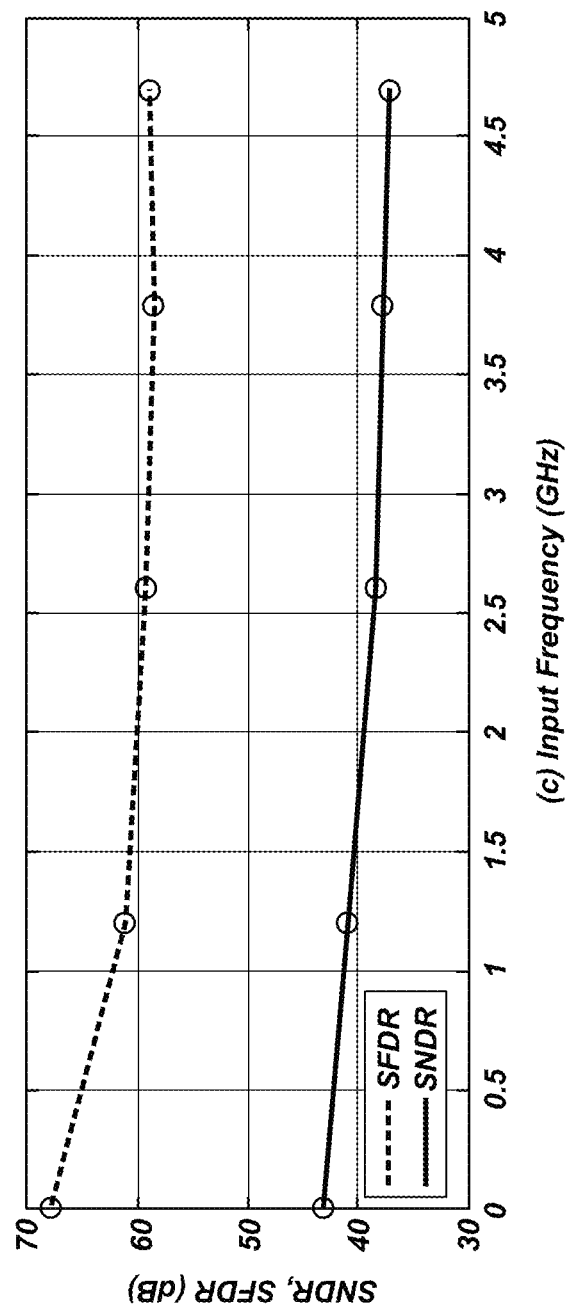
FIG. 24 is a plot that shows the SNDR and SFDR versus the input frequency at a sampling frequency of 10 GHz.

FIG. 24 plots the SNDR and SFDR versus the input frequency at a sampling frequency of 10 GHz. The ADC consumes a total of 21 mW from a 1-V supply. This includes 2.9 mW in the comparator, 0.7 mW in the DAC, 15.5 mW in the SAR logic, and 1.5 mW in the clock generator according to simulations.

Owing to the DAC design of the first embodiment and efficient clock generation with a low channel count, they respectively consume only 3.3% and 7.1% of the total power. The biggest power consumer is the SAR logic (74%), suggesting that there is ample room for the converter to benefit from CMOS scaling far into the foreseeable future. Among the state-of-the-art ADCs with similar speeds, our ADC achieves the best FoM at 37 fJ/conv.-step.

FIG. 25 is a table showing the performance summary and comparison of the first embodiment and the prior art.

In summary, the first embodiment teaches an 8-bit 10-GHz 8 X time-interleaved SAR ADC that implements an aggressively scaled DAC with grouped capacitors to afford a threefold reduction in the bottom-plate parasitic capacitance for high speed and high power efficiency. The effect of gradient on the grouped-capacitor DAC was also rigorously analyzed. The DAC utilizes quantized sub-radix-2 scaling with redistributed redundancy to tolerate dynamic errors. The dual-path bootstrapped switch improves the sampling SFDR by more than 5 dB by isolating the critical signal from the Nwell capacitance. Fabricated in a 28-nm CMOS technology, the ADC of the first embodiment implements high-speed, low-power techniques to obtain an SNDR of 36.9 dB at Nyquist while consuming 21 mW, yielding an FoM of 37 fJ/conv.-step, the best among state-of-the-art.

In a first embodiment, a digital-to-analog converter (DAC) is comprised of a top plate having a comb-like structure with a plurality of metallic fingers, the top plate fingers having a uniform length and all being electrically coupled together to form an output, wherein each of the top plate fingers is of a uniform length; a plurality of bottom plates forming bottom plate bit fingers, wherein each of the bottom plate bit fingers is interleaved between two adjacent top plate fingers, wherein each of the bottom plate bit fingers may be full length or half length; an insulator disposed between the top plate fingers and each of the plurality of bottom plates to thereby create capacitance between the top plate and the plurality of bottom plates bit fingers; a plurality of dummy fingers that are interleaved between some of the bit fingers to thereby provide shielding between bit fingers; wherein the plurality of bottom plate bit fingers are inputs that represent bits, wherein the bits are formed by powers of two such that the first bit has a single bit finger, the second bit has two bit fingers, the third bit has four bit fingers, and so on until all of the bits are represented by the appropriate number of bit fingers; and wherein the bit fingers for each bit are grouped so as to be adjacent to each other in bit finger groups.

In addition a method is taught for increasing power efficiency and speed of a digital-to-analog converter (DAC), said method comprising the steps of providing a top plate having a comb-like structure with a plurality of metallic fingers, the top plate fingers having a uniform length and all being electrically coupled together to form an output, wherein each of the top plate fingers is of a uniform length; providing a plurality of bottom plates forming bottom plate bit fingers, wherein each of the bottom plate bit fingers is interleaved between two adjacent top plate fingers; disposing an insulator between the top plate fingers and each of the plurality of bottom plates to thereby create capacitance between the top plate and the plurality of bottom plates bit fingers; providing a plurality of dummy fingers that are interleaved between some of the bit fingers to thereby provide shielding between bit fingers; wherein the plurality of bottom plate bit fingers are inputs that represent bits, wherein the bits are formed by powers of two such that the first bit has a single bit finger, the second bit has two bit fingers, the third bit has four bit fingers, and so on until all of the bits are represented by the appropriate number of bit fingers; and increasing power efficiency by grouping the bit fingers for each bit so as to be adjacent to each other in bit finger groups to thereby having less exposure to parasitic capacitances, and wherein each of the bottom plate bit fingers may be full length or half-length to thereby achieve a desired capacitive scaling.

Although only a few example embodiments have been described in detail above, those skilled in the art will readily appreciate that many modifications are possible in the example embodiments without materially departing from this invention. Accordingly, all such modifications are intended to be included within the scope of this disclosure as defined in the following claims. It is the express intention of the applicant not to invoke 35 U.S.C. § 112, paragraph 6 for any limitations of any of the claims herein, except for those in which the claim expressly uses the words 'means for' together with an associated function.

What is claimed is:

1. A digital-to-analog converter (DAC), said DAC comprised of:
   a top plate having a comb-like structure with a plurality of metallic fingers, the top plate fingers having a uniform length, and all being electrically coupled together to form an output, wherein each of the top plate fingers is of a uniform length;
   a plurality of bottom plates forming bottom plate bit fingers, wherein each of the bottom plate bit fingers is interleaved between two adjacent top plate fingers, wherein each of the bottom plate bit fingers may be full length or half length;
   an insulator disposed between the top plate fingers and each of the plurality of bottom plates to thereby create capacitance between the top plate and the plurality of bottom plates bit fingers;
   a plurality of dummy fingers that are interleaved between some of the bit fingers to thereby provide shielding between bit fingers;
   wherein the plurality of bottom plate bit fingers are inputs that represent bits, wherein the bits are formed by powers of two such that the first bit has a single bit finger, the second bit has two bit fingers, the third bit has four bit fingers, and so on until all of the bits are represented by the appropriate number of bit fingers; and
   wherein the bit fingers for each bit are grouped so as to be adjacent to each other in bit finger groups.

2. The DAC as defined in claim 1 wherein the DAC is further comprised of:
   a first bit finger representing the first bit and being disposed at a midpoint of the DAC, wherein the first bit finger is a half finger that is defined as a single unit capacitor;
   two dummy fingers on opposite sides of the first bit finger; and
   a series of alternating bit fingers and dummy fingers proceeding outwards symmetrically on both sides of the first bit finger, the bit fingers forming the bit finger groups on each side of the first bit finger.

3. The DAC as defined in claim 2 wherein the series of alternating bit fingers and dummy fingers is further comprised of:
   two second bit fingers disposed on opposites sides of the two dummy fingers that are immediately adjacent to the first bit finger; wherein the two second bit fingers are both half fingers and add up to two unit capacitors; and
   two dummy fingers on opposite sides of the second bit fingers.

4. The DAC as defined in claim 3 wherein the series of alternating bit fingers and dummy fingers is further comprised of two third bit fingers disposed on opposites sides of the two dummy fingers that are immediately adjacent to the second bit fingers; wherein the two third bit fingers are both full fingers and add up to four unit capacitors.

5. The DAC as defined in claim 4 wherein the series of alternating bit fingers and dummy fingers is further comprised of:
   two fourth bit pairs of fingers disposed on opposites sides of the two third bit fingers, one pair on one side and one pair on the opposite side, wherein each pair includes a full fourth bit finger and a half fourth bit finger and the two pairs adding up to six unit capacitors;

two dummy fingers, one dummy finger disposed between each of the fourth bit finger pairs; and two dummy fingers on opposite sides of the pairs of fourth bit fingers.

6. The DAC as defined in claim 5 wherein the series of alternating bit fingers and dummy fingers is further comprised of:

two fifth bit fingers disposed on opposites sides of the two dummy fingers, wherein the fifth bit fingers are each a half finger;

two dummy fingers, one dummy finger disposed on opposite sides of the fifth bit fingers; and two fifth bit pairs of fingers disposed on opposites sides of the two dummy fingers, one pair on one side and one pair on the opposite side, wherein each pair are full fingers, the six fifth bit fingers adding up to ten unit capacitors.

7. The DAC as defined in claim 6 wherein the series of alternating bit fingers and dummy fingers is further comprised of two groups of four sixth bit fingers disposed on opposites sides of the two fifth bit pairs of fingers, wherein the sixth bit fingers are each a full finger, the eight sixth bit fingers adding up to 16 unit capacitors.

8. The DAC as defined in claim 7 wherein the series of alternating bit fingers and dummy fingers is further comprised of two groups of seven seventh bit fingers disposed on opposites sides of the two groups of sixth bit fingers, wherein the seventh bit fingers are each a full finger, the fourteen seventh bit fingers adding up to 28 unit capacitors.

9. The DAC as defined in claim 8 wherein the series of alternating bit fingers and dummy fingers is further comprised of two groups of 15 eighth bit fingers disposed on opposites sides of the two groups of seventh bit fingers, wherein the eighth bit fingers are each a full finger, the six fifth bit fingers adding up to 60 unit capacitors.

10. A method of increasing power efficiency and speed of a digital-to-analog converter (DAC), said method comprising:

providing a top plate having a comb-like structure with a plurality of metallic fingers, the top plate fingers having a uniform length, and all being electrically coupled together to form an output, wherein each of the top plate fingers is of a uniform length;

providing a plurality of bottom plates forming bottom plate bit fingers, wherein each of the bottom plate bit fingers is interleaved between two adjacent top plate fingers;

disposing an insulator between the top plate fingers and each of the plurality of bottom plates to thereby create capacitance between the top plate and the plurality of bottom plates bit fingers;

providing a plurality of dummy fingers that are interleaved between some of the bit fingers to thereby provide shielding between bit fingers;

wherein the plurality of bottom plate bit fingers are inputs that represent bits, wherein the bits are formed by powers of two such that the first bit has a single bit finger, the second bit has two bit fingers, the third bit has four bit fingers, and so on until all of the bits are represented by the appropriate number of bit fingers; and increasing power efficiency by grouping the bit fingers for each bit so as to be adjacent to each other in bit finger groups to thereby having less exposure to parasitic capacitances, and wherein each of the bottom plate bit fingers may be full length or half-length to thereby achieve a desired capacitive scaling.

\* \* \* \* \*